(12) United States Patent
Kuwahara

(10) Patent No.: US 11,842,475 B2
(45) Date of Patent: *Dec. 12, 2023

(54) HOLDING APPARATUS, CONTROL SYSTEM AND INSPECTION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventor: Hiroaki Kuwahara, Yokohama (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/521,108

(22) Filed: Nov. 8, 2021

(65) Prior Publication Data
US 2022/0058791 A1 Feb. 24, 2022

Related U.S. Application Data

(62) Division of application No. 16/745,503, filed on Jan. 17, 2020, now Pat. No. 11,200,660.

(30) Foreign Application Priority Data

Jan. 21, 2019 (JP) .................................. 2019-007712

(51) Int. Cl.
*G06T 7/00* (2017.01)
*G01N 21/954* (2006.01)
(Continued)

(52) U.S. Cl.
CPC .............. *G06T 7/0004* (2013.01); *B25J 5/00* (2013.01); *B25J 5/005* (2013.01); *B25J 5/007* (2013.01);
(Continued)

(58) Field of Classification Search
CPC .......... G06T 7/0004; G06T 2207/30164; B25J 5/00; B25J 5/005; B25J 5/007;
(Continued)

(56) References Cited

U.S. PATENT DOCUMENTS 5,798,651 A * 8/1998 Aruga .................... G01R 31/01
324/750.25
7,221,178 B2 * 5/2007 Takahama ................ H02G 1/04
356/399
(Continued)

FOREIGN PATENT DOCUMENTS

JP 60-31991 A 2/1985
JP 61-209892 A 9/1986
(Continued)

*Primary Examiner* — Isiaka O Akanbi
(74) *Attorney, Agent, or Firm* — Oblon, McClelland, Maier & Neustadt, L.L.P.

(57) ABSTRACT

According to one embodiment, a holding apparatus holds a moving body and changes a position of the moving body in a second direction perpendicular to a surface of a columnar body. The surface of the columnar body extends in the first direction. The moving body is movable along the first direction. The apparatus includes first and second holders separated from each other. The first holder includes first and second portions separated from each other, and a third portion. The second holder includes fourth and fifth portions separated from each other, and a sixth portion. The moving body is held by the first and second holders in a state in which the moving body is at a hold position. The hold position is where the moving body opposes the third and sixth portions and is between the first and second portions and between the fourth and fifth portions.

14 Claims, 15 Drawing Sheets

(51) Int. Cl.
*B25J 5/00* (2006.01)
*G01R 31/34* (2020.01)
*H02K 15/00* (2006.01)

(52) U.S. Cl.
CPC ........... *G01N 21/954* (2013.01); *G01R 31/34* (2013.01); *H02K 15/00* (2013.01); *G01N 2021/9544* (2013.01); *G06T 2207/30164* (2013.01)

(58) Field of Classification Search
CPC ......... G01N 21/954; G01N 2021/9544; G01R 31/34; H02K 15/00
USPC ............... 198/339.1; 414/409, 426, 433, 434
See application file for complete search history.

(56) References Cited

U.S. PATENT DOCUMENTS

| | | | |
|---|---|---|---|
| 7,520,189 B2 | 4/2009 | Abbasi et al. | |
| 10,131,025 B2* | 11/2018 | Kitayama | B23K 26/04 |
| 2003/0059100 A1* | 3/2003 | Fleming | F16C 11/12 |
| | | | 382/141 |
| 2007/0268540 A1* | 11/2007 | Gaspardo | G06T 7/579 |
| | | | 359/196.1 |
| 2012/0200860 A1* | 8/2012 | Gaspardo | G06T 7/579 |
| | | | 356/601 |
| 2018/0128879 A1 | 5/2018 | Kuwahara et al. | |
| 2019/0130556 A1 | 5/2019 | Kuwahara et al. | |

FOREIGN PATENT DOCUMENTS

| | | |
|---|---|---|
| JP | 3-64983 A | 3/1991 |
| JP | 6-9589 B2 | 2/1994 |
| JP | 4618247 B2 | 1/2011 |
| JP | 5750383 B2 | 7/2015 |
| JP | 2017-56507 A | 3/2017 |
| JP | 2018-75979 A | 5/2018 |
| JP | 2019-82455 A | 5/2019 |
| JP | 2019-171481 A | 10/2019 |

* cited by examiner

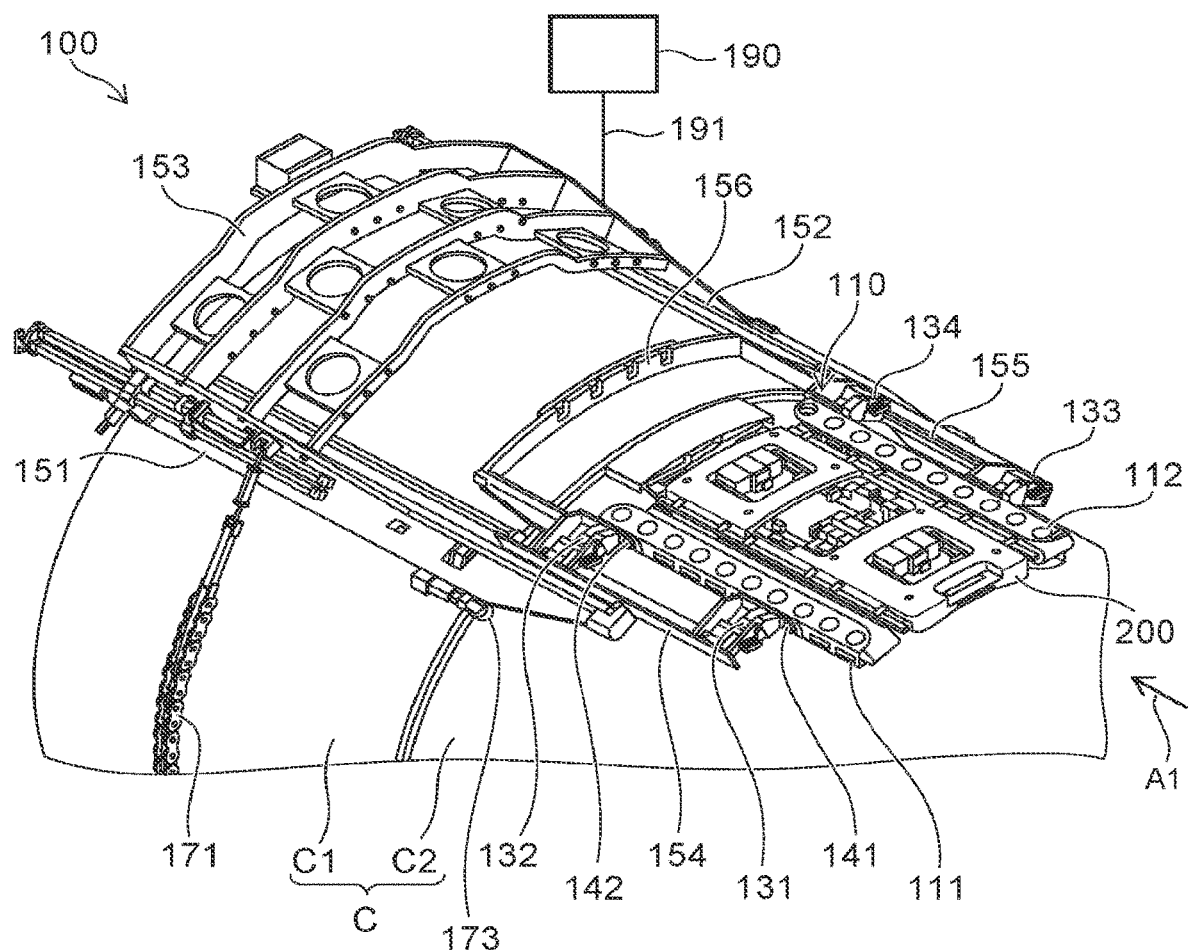
FIG. 2
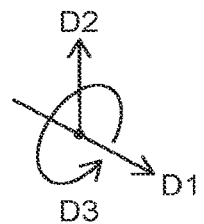

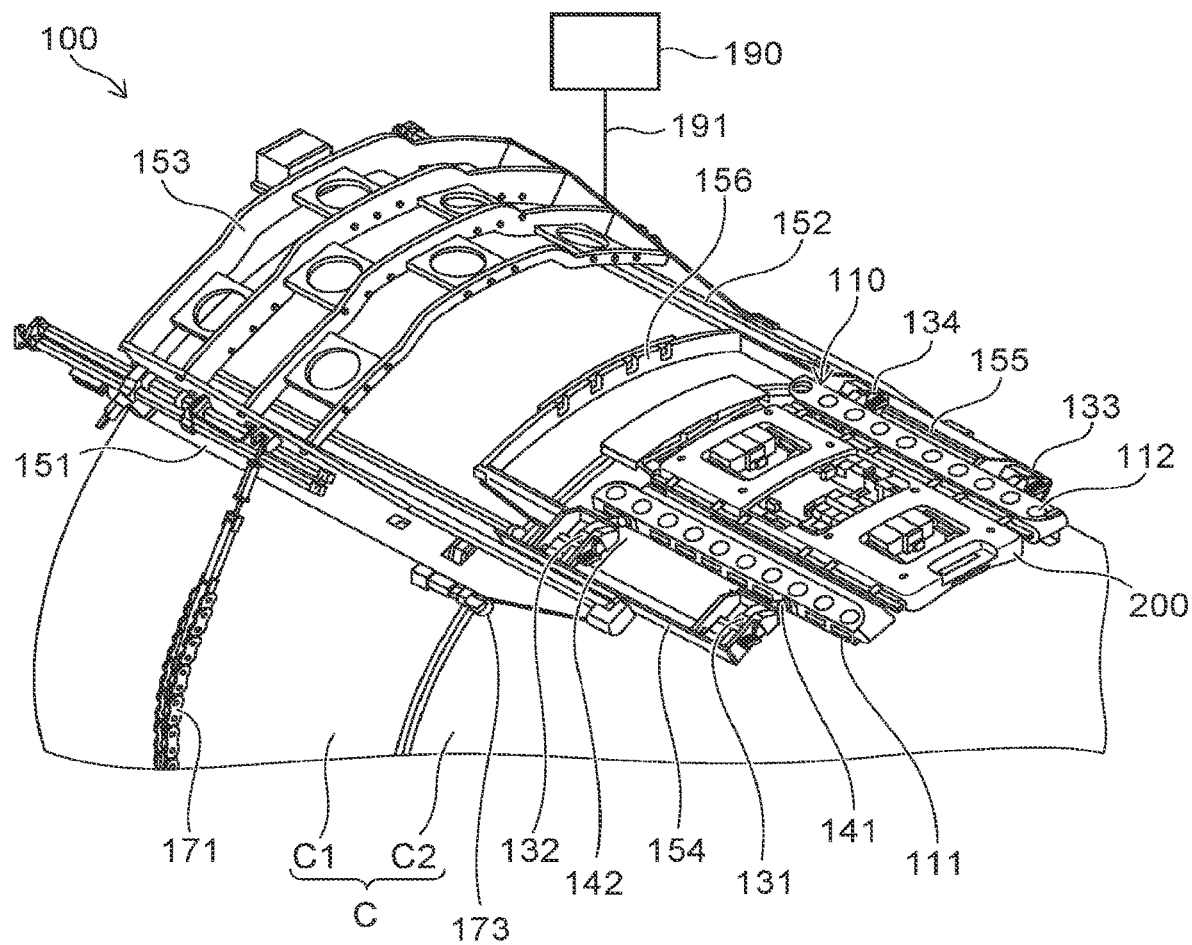
FIG. 3
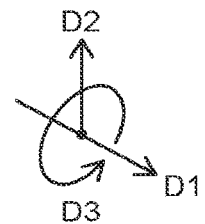

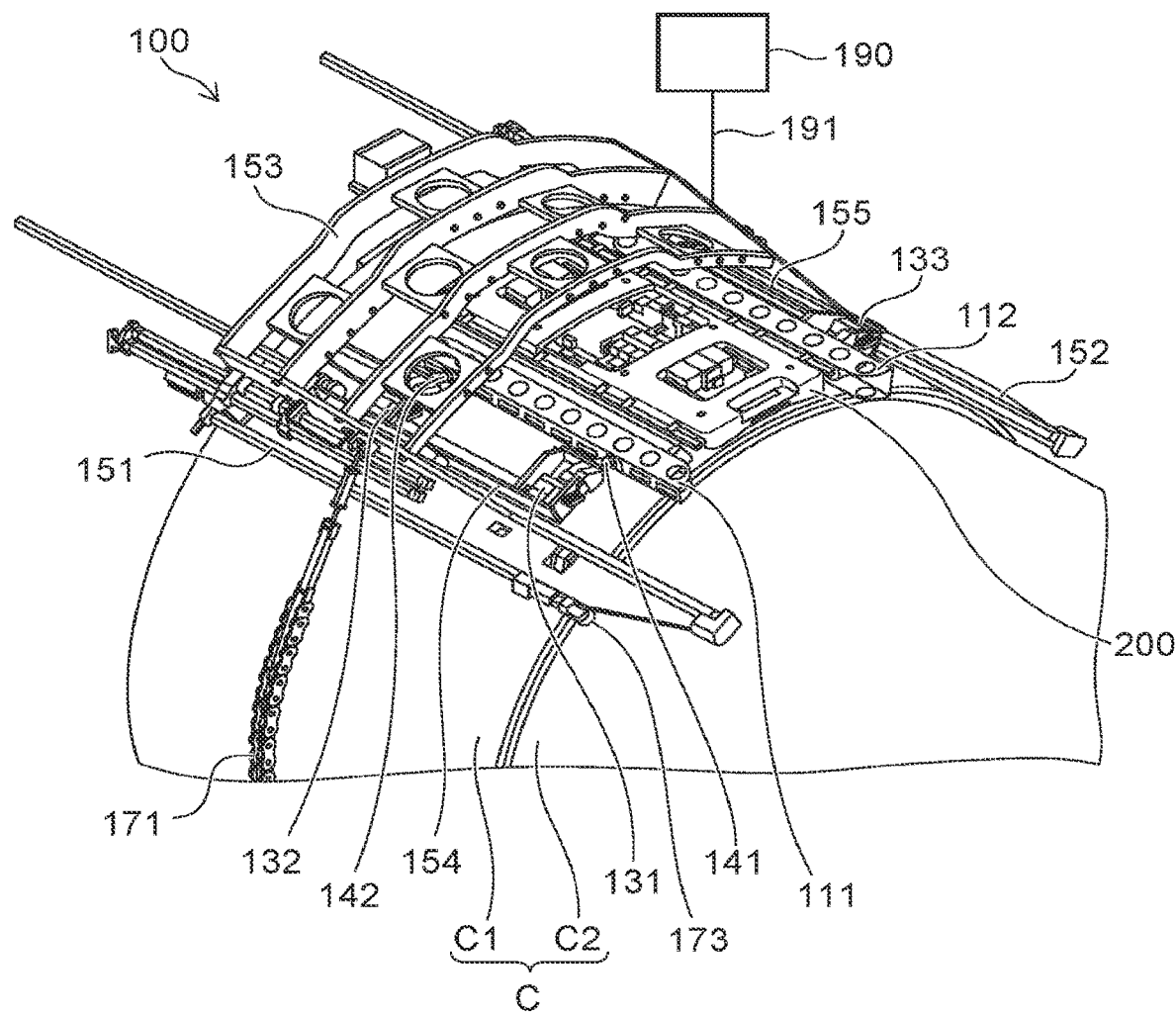
FIG. 4
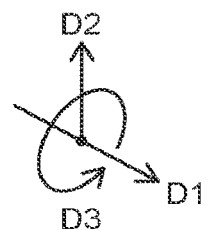

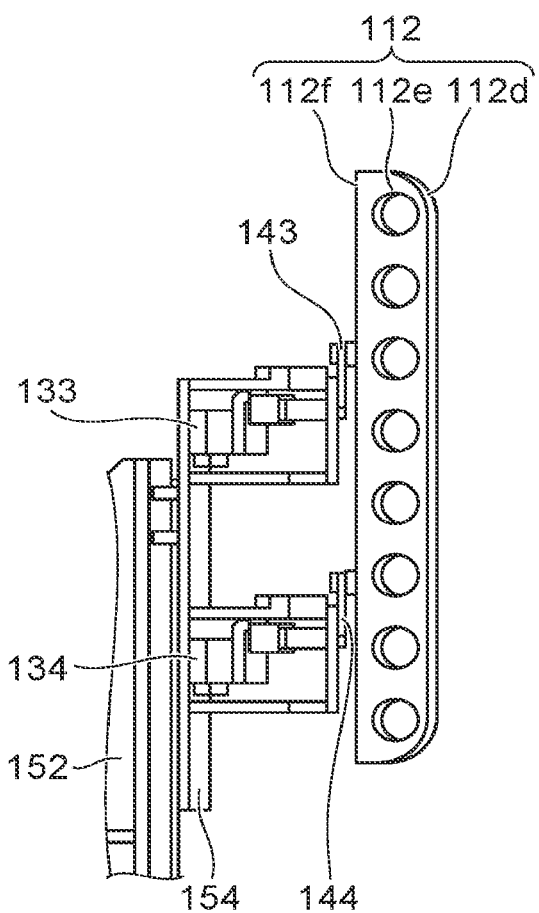
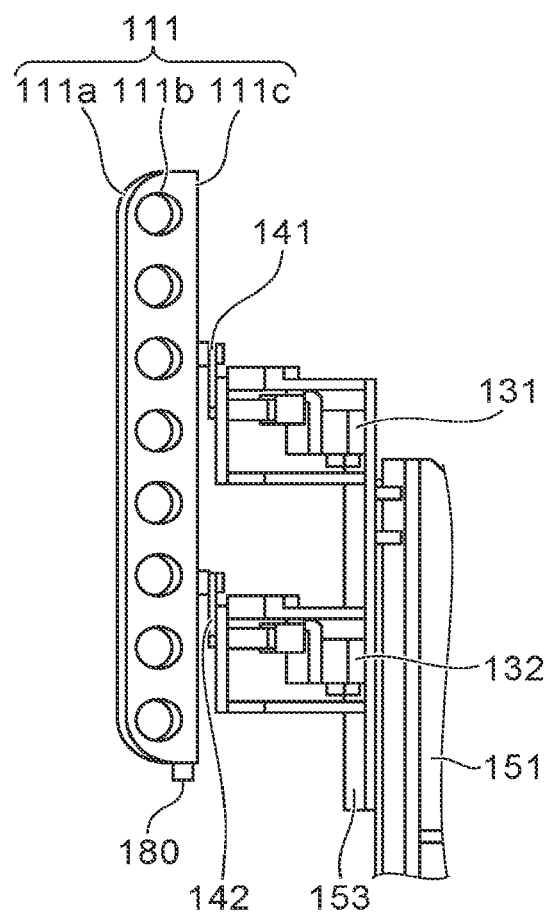
FIG. 5A
FIG. 5B
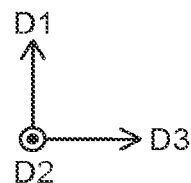
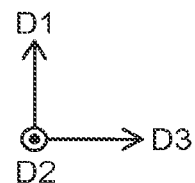

$$\begin{bmatrix} p1 \\ p2 \\ p3 \\ p4 \end{bmatrix} = \begin{bmatrix} 1 & 1 & 1 & 1 \\ 1 & -1 & 1 & -1 \\ 1 & 1 & -1 & -1 \\ 1 & -1 & -1 & 1 \end{bmatrix} = \begin{bmatrix} z1 \\ z2 \\ z3 \\ z4 \end{bmatrix}$$
FIG. 13
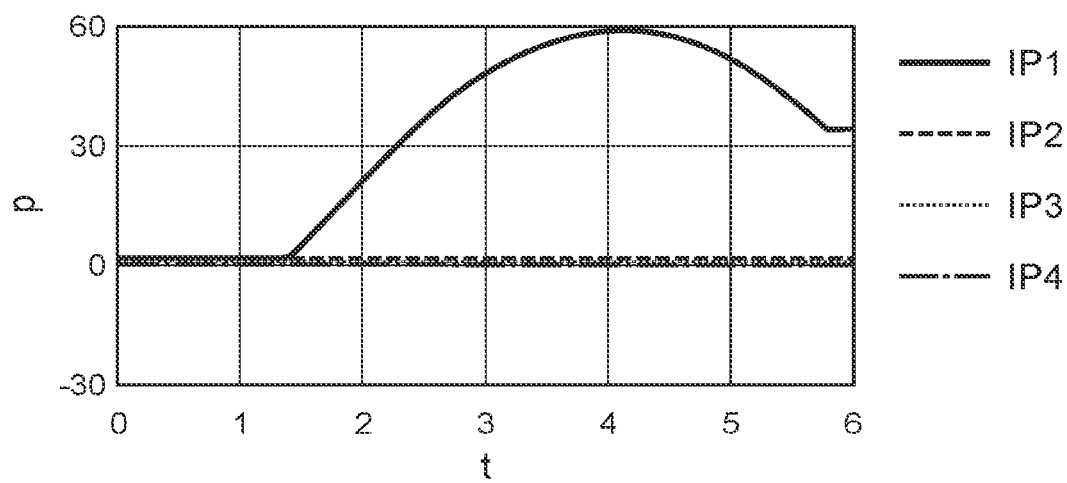
FIG. 14A
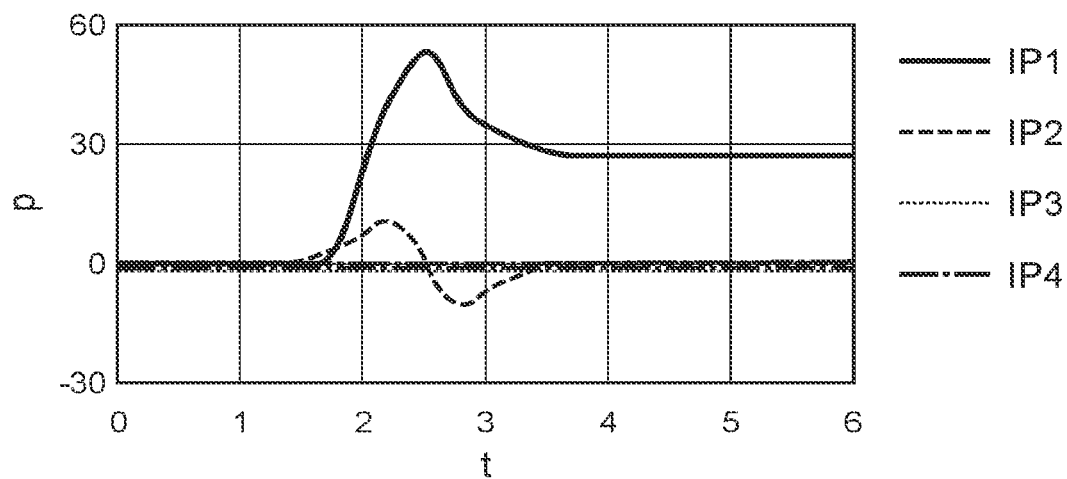
FIG. 14B

HOLDING APPARATUS, CONTROL SYSTEM AND INSPECTION SYSTEM

CROSS-REFERENCE TO RELATED APPLICATIONS

This application is a Divisional of U.S. application Ser. No. 16/745,503 filed Jan. 17, 2020, and is based upon and claims the benefit of priority from Japanese Patent Application No. 2019-007712, filed on Jan. 21, 2019; the entire contents of each of which are incorporated herein by reference.

FIELD

Embodiments described herein relate generally to a holding apparatus, a control system, and an inspection system.

BACKGROUND

There is a holding apparatus that holds a moving body movable in a prescribed direction. It is desirable for the holding apparatus to be compact so that the holding apparatus can be provided in a narrow space (a gap) when the moving body moves through the narrow space, To downsize the holding apparatus, it is effective to downsize the drivers included in the holding apparatus. However, when the drivers are downsized, the output of the holding apparatus decreases; and there is a possibility that the holding of the moving body may become unstable. Therefore, technology is desirable in which the moving body can be held more stably even when the output of the holding apparatus is small.

BRIEF DESCRIPTION OF THE DRAWINGS

FIG. 2 is a perspective view illustrating the holding apparatus according to the embodiment;

FIG. 3 is a perspective view illustrating the holding apparatus according to the embodiment;

FIG. 4 is a perspective view illustrating the holding apparatus according to the embodiment;

FIGS. 5A and 5B are plan views illustrating portions of the holding apparatus according to the embodiment;

FIG. 13 is a formula to which the holding apparatus according to the embodiment refers;

FIGS. 14A and 14B are graphs illustrating changes of the positions in the second direction of the imaginary planes when the moving body is moved;

DETAILED DESCRIPTION

Figure 1:
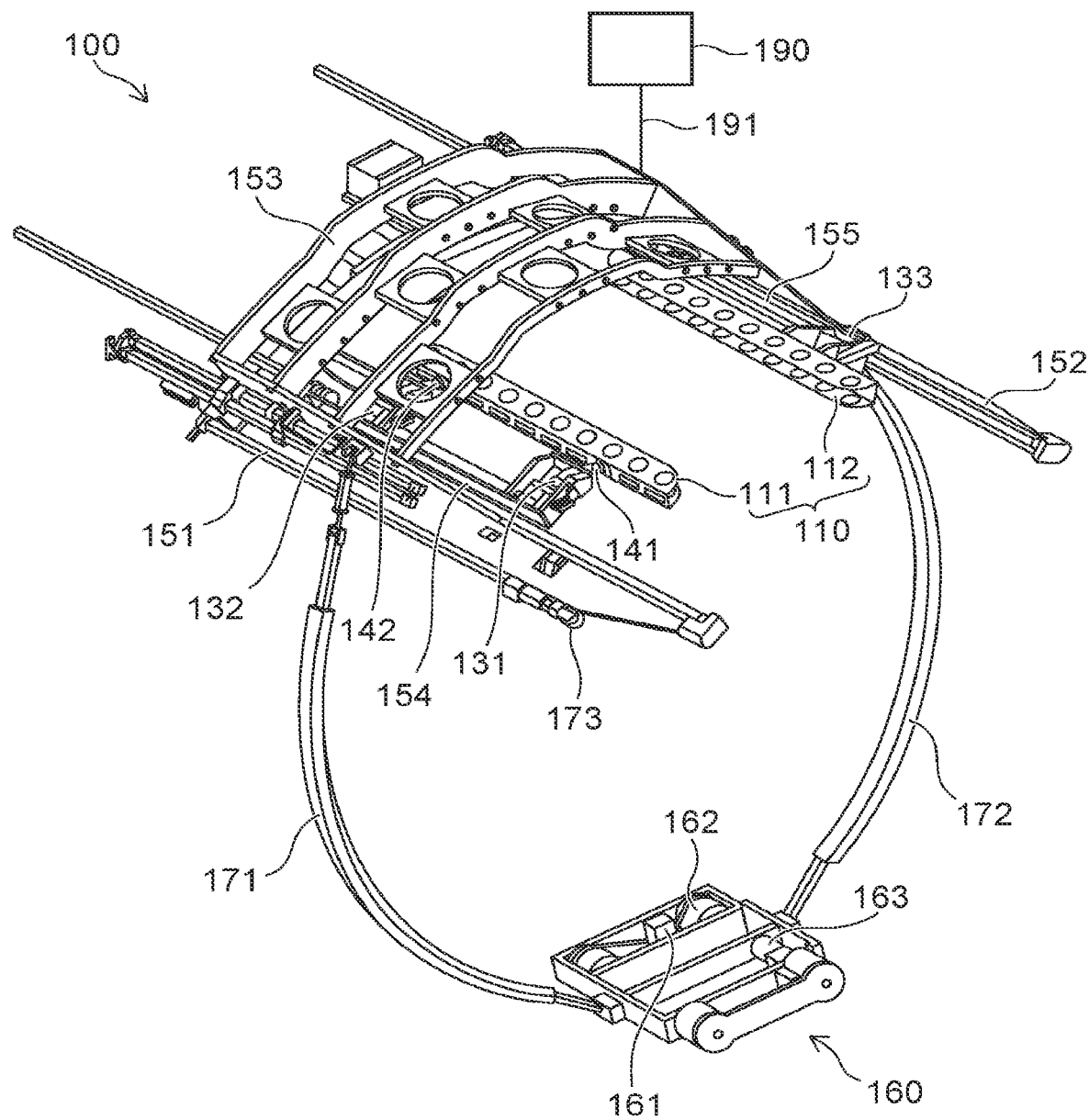
FIG. 1 is a perspective view illustrating a holding apparatus according to an embodiment.
Figure 1:
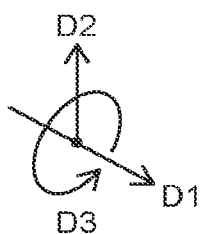

According to one embodiment, a holding apparatus holds a moving body and changes a position of the moving body in a second direction perpendicular to a surface of a columnar body. The surface of the columnar body extends in the first direction. The moving body is movable along the first direction. The apparatus includes a first holder and a second holder separated from each other in a third direction perpendicular to the first direction and the second direction. The first holder includes a first portion and a second portion separated from each other in the second direction, and a third portion. The second holder includes a fourth portion and a fifth portion separated from each other in the second direction, and a sixth portion. The moving body is held by the first holder and the second holder in a state in which the moving body is at a hold position. The hold position is where the moving body opposes the third portion and the sixth portion in the third direction and is between the first portion and the second portion and between the fourth portion and the fifth portion in the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 to FIG. 4 are perspective views illustrating a holding apparatus according to an embodiment.

FIGS. 5A and 5B are plan views illustrating portions of the holding apparatus according to the embodiment.

As illustrated in FIG. 1 to FIG. 4, the holding apparatus 100 according to the embodiment includes a holding mechanism 110. The holding mechanism 110 is configured to hold a moving body 200 illustrated in FIG. 2 to FIG. 4. The holding mechanism 110 includes a first holder 111 and a second holder 112 for holding the moving body 200. The moving body 200 is held between the first holder 111 and the second holder 112, FIG. 2 to FIG. 4 illustrate a state in which the holding apparatus 100 is mounted to a columnar body C. The columnar body C extends in a first direction D1. For example, the columnar body C is a circular column; and the center of the columnar body C is parallel to the first direction D1. Or, the columnar body C may be a prism. For example, a not-illustrated tubular body is provided around the columnar body C. The tubular body is a circular tube or a quadrilateral tube. For example, the holding apparatus 100 and the moving body 200 are provided in a gap between the columnar body C and the tubular body.

The moving body 200 moves over the surface of the columnar body C along the first direction D1. For example, the columnar body C includes a first columnar part C1 and a second columnar part C2. The first columnar part C1 and the second columnar part C2 are arranged in the first direction D1. The dimension of the first columnar part C1 in a direction perpendicular to the first direction D1 is longer than the dimension of the second columnar part C2 in the perpendicular direction. For example, the surface of the first columnar part C1 is linked to the surface of the second columnar part C2, A level difference exists between the surface of the first columnar part C1 and the surface of the second columnar part C2.

For example, the holding apparatus 100 is mounted to the first columnar part C1. The moving body 200 moves over the surface of the second columnar part C2 along the first direction D1. The holding apparatus 100 places the first holder 111 and the second holder 112 at the surface of the second columnar part C2. The moving body 200 moves between the first holder 111 and the second holder 112 placed at the surface of the second columnar part C2 and is held by the first holder 111 and the second holder 112.

Multiple drivers are connected to the holding mechanism 110. FIG. 5A illustrates the second holder 112 of the holding mechanism 110; and FIG. 5B illustrates the first holder 111 of the holding mechanism 110, For example, as illustrated in FIG. 5A and FIG. 5B, the holding apparatus 100 includes first to fourth drivers 131 to 134 and first to fourth links 141 to 144. The first driver 131 and the second driver 132 are connected to the first holder 111 respectively via the first link 141 and the second link 142. The third driver 133 and the fourth driver 134 are connected to the second holder 112 respectively via the third link 143 and the fourth link 144.

When the first to fourth drivers 131 to 134 are operated, the drive forces are transferred to the first holder 111 and the second holder 112 via the first to fourth links 141 to 144. The position of the moving body 200 in a second direction D2 perpendicular to the surface of the columnar body C can be changed by operating the first to fourth drivers 131 to 134 in the state in which the moving body 200 is held. The second direction D2 is perpendicular to the first direction D1. An example of the second direction D2 is shown in the drawings.

For example, the holding apparatus 100 switches the position in the second direction D2 of the moving body 200 between a first position and a second position. At the first position, the moving body 200 is proximal to the surface of the columnar body C; and the moving body 200 that is between the first holder 111 and the second holder 112 can move toward the surface of the columnar body C. FIG. 2 illustrates the state when the moving body 200 is at the first position.

At the second position, compared to the first position, the moving body 200 is separated from the surface of the columnar body C, In other words, the distance between the second position and the surface of the columnar body C is longer than the distance between the first position and the surface of the columnar body C. FIG. 3 illustrates the state when the moving body 200 is at the second position.

For example, the first holder 111 and the second holder 112 contact a portion of the surface of the columnar body C when the moving body 200 is at the first position. The holding apparatus 100 moves the moving body 200 in a direction perpendicular to the portion of the surface of the columnar body C. When the moving body 200 is at the second position, the first holder 111 and the second holder 112 are separated from the portion of the surface of the columnar body C.

In the example illustrated in FIG. 1 to FIG. 5B, the holding apparatus 100 further includes a pair of bases 151 and 152, a connector 153, a pair of sliders 154 and 155, and a connector 156.

The first driver 131 and the second driver 132 are fixed to the slider 154, The slider 154 is slidable along the first direction D1 with respect to the base 151. Similarly, the third driver 133 and the fourth driver 134 are fixed to the slider 155. The slider 155 is slidable along the first direction D1 with respect to the base 152.

The bases 151 and 152 do not move other than when operating a movement mechanism 160 described below. Accordingly, the holding mechanism 110 moves along the first direction D1 when the sliders 154 and 155 slide with respect to the bases 151 and 152, The moving body 200 also moves along the first direction D1 when the moving body 200 is held by the holding mechanism 110.

The holding mechanism 110 and the moving body 200 are moved from the state illustrated in FIG. 3 to the state illustrated in FIG. 4 by the operations of the sliders 154 and 155. In other words, by the operations of the sliders 154 and 155, the state in which the holding mechanism 110 and the moving body 200 oppose the second columnar part C2 in the second direction D2 and the state in which the holding mechanism 110 and the moving body 200 oppose the first columnar part C1 in the second direction D2 can be switched.

For example, the holding apparatus 100 moves the holding mechanism 110 toward the first columnar part C1 from the state illustrated in FIG. 4 through the states illustrated in FIG. 2 and FIG. 3. The holding apparatus 100 causes the first holder 111 and the second holder 112 to contact the surface of the first columnar part C1. Thereby, the moving body 200 that is between the first holder 111 and the second holder 112 is in a state of being movable toward the surface of the first columnar part C1. By the operations described above, the moving body 200 can be moved from the surface of the second columnar part C2 to the surface of the first columnar part C1.

Or, the holding apparatus 100 causes the first holder 111 and the second holder 112 to approach the surface of the first columnar part C1 and forms a state in which the moving body 200 can move between the first holder 111 and the second holder 112 from the surface of the first columnar part C1. When the holding apparatus 100 holds the moving body 200 on the surface of the first columnar part C1, the first holder 111 and the second holder 112 move through the states illustrated in FIG. 4 and FIG. 3 and are caused to contact the surface of the second columnar part C2 as illustrated in FIG. 2. By the operations described above, the moving body 200 can be moved from the surface of the first columnar part C1 to the surface of the second columnar part C2.

The bases 151 and 152 are rigid. Accordingly, the positional relationship between the base 151 and the base 152 substantially does not change in the operations of the sliders 154 and 155, the operations of the first to fourth drivers 131 to 134, etc. Also, as illustrated in FIG. 1 to FIG. 4, the bases 151 and 152 are connected to each other by the connector 153 which is rigid. The change of the positional relationship between the base 151 and the base 152 can be suppressed further by the base 151 and the base 152 being connected by the connector 153.

Similarly, the sliders 154 and 155 are rigid. Accordingly, the positional relationship between the slider 154 and the slider 155 substantially does not change in the operations of the first to fourth drivers 131 to 134, etc. The sliders 154 and 155 are connected to each other by the connector 156 which is rigid. The change of the positional relationship between the slider 154 and the slider 155 can be suppressed further by the slider 154 and the slider 155 being connected by the connector 156.

As illustrated in FIG. 1, the holding apparatus 100 further includes the movement mechanism 160. The movement mechanism 160 moves the holding mechanism 110 along a third direction D3. The third direction D3 is perpendicular to the first direction D1 and the second direction D2. By moving the holding mechanism 110 along the third direction D3, the position in the third direction D3 of the moving body 200 that is held changes. For example, in the case where the columnar body C has a circular columnar configuration, the first direction D1 is parallel to the central axis. The second direction D2 corresponds to the diametrical direction of the columnar body C. The third direction D3 corresponds to the circumferential direction of the columnar body C.

The holding apparatus 100 operates the movement mechanism 160 while holding the moving body 200 in a state of being separated from the columnar body C. The position in the third direction D3 of the moving body 200 is changed thereby. When the position of the moving body 200 changes, the holding apparatus 100 moves the moving body 200 toward the columnar body C by operating the first to fourth drivers 131 to 134. Thereby, the moving body 200 can move along the first direction D1 at a location different from the location before being held. For example, the movement in the first direction D1 of the moving body 200 and the movement in the third direction D3 of the moving body 200 due to the holding apparatus 100 are repeated alternately.

For example, the movement mechanism 160 is provided to be separated from the holding mechanism 110; and the columnar body C is positioned between the holding mechanism 110 and the movement mechanism 160. The movement mechanism 160 is coupled to the base 151 by a first coupler 171 and coupled to the base 152 by a second coupler 172. The holding mechanism 110, the movement mechanism 160, the first coupler 171, and the second coupler 172 are coupled in a ring configuration and are wound onto the columnar body C.

For example, the length of the first coupler 171 is substantially the same as the length of the second coupler 172. By providing the holding mechanism 110 and the movement mechanism 160 so that the columnar body C is positioned between the holding mechanism 110 and the movement mechanism 160, the movement mechanism 160 and the holding mechanism 110 act as mutual counterweights. For example, the change of the position in the third direction D3 of the holding mechanism 110 or the movement mechanism 160 can be suppressed by the weight of the holding mechanism 110 or the movement mechanism 160.

The movement mechanism 160 includes, for example, a roller 161, a motor 162, and an encoder 163. The roller 161 is connected to the motor 162 and contacts the surface of the columnar body C. The roller 161 rotates when the motor 162 operates. The movement mechanism 160 is moved over the surface of the columnar body C along the third direction D3 by the rotation of the roller 161. The movement mechanism 160 is coupled to the bases 151 and 152 by the first coupler 171 and the second coupler 172. Therefore, when the movement mechanism 160 moves, the holding mechanism 110 also moves along the third direction D3.

The encoder 163 detects the rotational speed (or the rotation angle) of the motor 162 or the roller 161. The encoder 163 calculates the movement distance of the movement mechanism 160 in the third direction D3 based on the detected rotational speed. In other words, the movement distance of the movement mechanism 160 is the movement distance of the holding mechanism 110. When the holding mechanism 110 holds the moving body 200, the movement distance of the movement mechanism 160 corresponds to the movement distance of the moving body 200.

Rollers 173 and 174 are provided respectively at the bases 151 and 152. The rollers 173 and 174 contact the surface of the columnar body C. For example, the rollers 173 and 174 contact the level difference between the surface of the first columnar part C1 and the surface of the second columnar part C2. The rollers 173 and 174 rotate according to the movement of the movement mechanism 160. Thereby, the bases 151 and 152 move smoothly around the columnar body C along the third direction D3.

Figure 6:
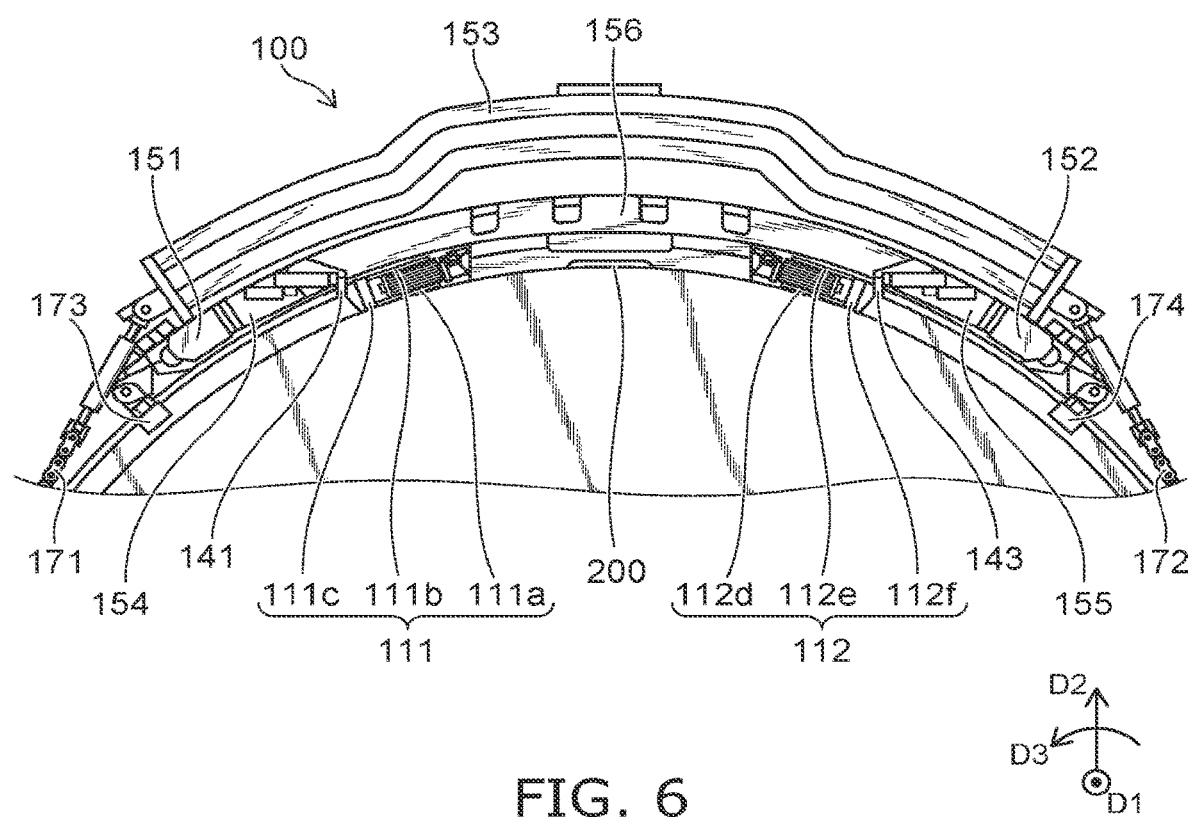
FIG. 6 is a front view illustrating the holding apparatus according to the embodiment.

FIG. 6 is a front view illustrating the holding apparatus according to the embodiment.

FIG. 6 illustrates the state when the holding apparatus 100 and the moving body 200 are viewed along the direction of arrow A1 illustrated in FIG. 2.

As illustrated in FIG. 5A to FIG. 6, the first holder 111 includes a first portion 111*a*, a second portion 111*b*, and a third portion 111*c*, The first portion 111*a* and the second portion 111*b* are separated from each other in the second direction D2. The position in the second direction D2 of the third portion 111*c* is between the position in the second direction D2 of the first portion 111*a* and the position in the second direction D2 of the second portion 111*b*. The first portion 111*a* and the second portion 111*b* may be linked to the third portion 111*c* or may be separated from the third portion 111*c*.

The second holder 112 includes a fourth portion 112*d*, a fifth portion 112*e*, and a sixth portion 112*f*. The fourth portion 112*d* and the fifth portion 112*e* are separated from each other in the second direction D2. The position in the second direction D2 of the sixth portion 112*f* is between the position in the second direction D2 of the fourth portion 112*d* and the position in the second direction D2 of the fifth portion 112*e*. The fourth portion 112*d* and the fifth portion 112*e* may be linked to the sixth portion 112*f* or may be separated from the sixth portion 112*f*.

For example, the first to third portions 111*a* to 111*c* and the fourth to sixth portions 112*d* to 112*f* have thin plate configurations and extend in the first direction D1. It is desirable for the lengths in the first direction D1 of the first to third portions ilia to 111*c* and the fourth to sixth portions 112*d* to 112*f* each to be about the same as or longer than the length in the first direction D1 of the moving body 200 to stably hold the moving body 200. Also, the first to third portions 111*a* to 111*c* and the fourth to sixth portions 112*d* to 112*f* are rigid so that these portions do not deform when holding the moving body 200.

As illustrated in FIG. 6, when the moving body 200 is held by the holding apparatus 100, the moving body 200 is stored at a hold position between the first holder 111 and the second holder 112. At the hold position, the moving body 200 opposes the third portion 111*c* and the sixth portion 112*f* in the third direction D3 and is between the first portion 111*a* and the second portion 111*b* and between the fourth portion 112*d* and the fifth portion 112*e* in the second direction D2. In other words, the two ends in the third direction D3 of the moving body 200 are positioned respectively inside the first holder 111 and the second holder 112 which are C-shaped.

Thereby, when the moving body 200 is moved by the holding apparatus 100, the movement of the moving body 200 between the first holder 111 and the second holder 112 due to vibrations, etc., can be suppressed.

A controller 190 controls the components of the holding apparatus 100. For example, the controller 190 operates the first to fourth drivers 131 to 134, the sliders 154 and 155, and the movement mechanism 160 by transmitting commands to these components. For example, the controller 190 has wired connections to the components via a cable 191. Or, the controller 190 may transmit a wireless signal to the components. Or, the controller 190 may be included in the bases 151 and 152, etc.

Effects of the embodiment will now be described.

In the holding apparatus 100 according to the embodiment, the holding mechanism 110 includes the first holder 111 and the second holder 112. The first holder 111 includes the first portion 111a, the second portion 111b, and the third portion 111c. The second holder 112 includes the fourth portion 112d, the fifth portion 112e, and the sixth portion 112f. The holding mechanism 110 holds the moving body 200 at the hold position by using the first holder 111 and the second holder 112.

At the hold position, the moving body 200 opposes the third portion 111c and the sixth portion 112f in the third direction D3 and is between the first portion 111a and the second portion 111b and between the fourth portion 112d and the fifth portion 112e in the second direction D2. Thereby, the movement of the moving body 200 in the second direction D2 or the third direction D3 between the first holder 111 and the second holder 112 can be suppressed when the holding apparatus 100 changes the position in the second direction D2 of the moving body 200. In other words, according to the holding apparatus 100 according to the embodiment or a control system including the holding apparatus 100 and the moving body 200, the position in the second direction D2 of the moving body 200 can be changed in a state in which the moving body 200 is held more stably.

The holding apparatus 100 can change the position in the third direction D3 of the moving body 200 by the movement mechanism 160. The moving body 200 is held at the hold position described above even when the moving body 200 is moved along the third direction D3. Therefore, the position in the third direction D3 of the moving body 200 can be changed in a state in which the moving body 200 is held more stably.

The first holder 111 may be configured to modify the distance (a first distance) in the second direction D2 between the first portion 111a and the second portion 111b. For example, the first holder 111 includes a driver that changes the first distance. Also, the second holder 112 may be configured to modify the distance (a second distance) in the second direction D2 between the fourth portion 112d and the fifth portion 112e, For example, the second holder 112 includes a driver that changes the second distance. These drivers include actuators (e.g., motors).

When the moving body 200 moves to the hold position between the first holder 111 and the second holder 112, the first holder 111 shortens the first distance; and the second holder 112 shortens the second distance. For example, the first holder 111 causes the first portion 111a and the second portion 111b to contact the moving body 200 and clamps the moving body 200 with the first portion 111a and the second portion 111b, The second holder 112 causes the fourth portion 112d and the fifth portion 112e to contact the moving body 200 and clamps the moving body 200 with the fourth portion 112d and the fifth portion 112e. By shortening the first distance and the second distance, the movement of the moving body 200 in the second direction D2 between the first holder 111 and the second holder 112 while the moving body 200 is held can be suppressed further.

The first holder 111 may be configured to modify the position in the third direction D3 of the third portion 111c. For example, the driver of the first holder 111 recited above changes the position in the third direction D3 of the third portion 111c. The second holder 112 may be configured to modify the position in the third direction D3 of the sixth portion 112f. For example, the driver of the second holder 112 recited above changes the position in the third direction D3 of the sixth portion 112f.

When the moving body 200 moves to the hold position between the first holder 111 and the second holder 112, the first holder 111 moves the third portion 111c and shortens the distance (a third distance) in the third direction D3 between the third portion 111c and the moving body 200. The second holder 112 moves the sixth portion 112f and shortens the distance (a fourth distance) in the third direction D3 between the third portion 111c and the moving body 200. For example, the first holder 111 causes the third portion 111c to contact the moving body 200; and the second holder 112 causes the sixth portion 112f to contact the moving body 200. By shortening the third distance and the fourth distance, the movement of the moving body 200 in the third direction D3 between the first holder 111 and the second holder 112 while the moving body 200 is held can be suppressed further.

As illustrated in FIG. 5B, the holding apparatus 100 may include a detector 180. The detector 180 detects the moving body 200 to be at the hold position. For example, the detector 180 includes an infrared sensor. The infrared sensor includes a light emitter and a light receiver. For example, the reflectance of a portion of the surface of the moving body 200 is configured to be larger than the reflectance of another portion of the surface. When the moving body 200 moves to the hold position, the infrared rays that are radiated from the light emitter are incident on the portion of the surface of the moving body 200. More intense infrared rays are reflected toward the light receiver; and the intensity of the reflected light detected by the light receiver changes. Based on the change of the reflected light intensity, the infrared sensor detects that the moving body 200 has moved to the hold position.

The detector 180 may include at least one of a through-beam sensor, a laser sensor, a magnet sensor, an ultrasonic sensor, a pressure sensor, an image sensor, or an optical position sensor, Or, the detector 180 may include a camera. The camera images the holding mechanism 110 and the moving body 200 and acquires an image, Based on the image, the detector 180 detects that the moving body 200 is at the hold position. Thus, the specific configuration of the detector 180 is modifiable as appropriate as long as the moving body 200 can be detected at the hold position.

When the holding apparatus 100 operates in a state in which the moving body 200 is at a position shifted from the desirable hold position, there is a possibility that the moving body 200 cannot be held stably. For example, there is a possibility that the moving body 200 may fall from the holding mechanism 110 while the moving body 200 is being moved. For example, when the detector 180 detects the moving body 200 to be at the hold position, the controller 190 moves the moving body 200 by using the holding mechanism 110. Thereby, the moving body 200 can be held more stably by the holding mechanism 110.

Figure 7A:
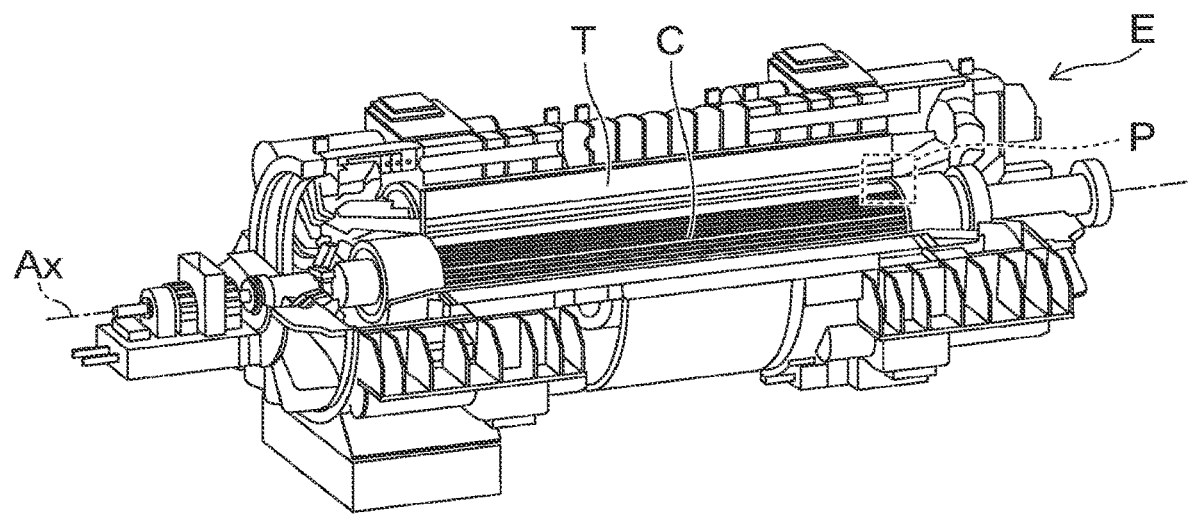
FIGS. 7A and 7B are perspective cross-sectional views illustrating an example of equipment to which the holding apparatus according to the embodiment is applied.
Figure 7B:
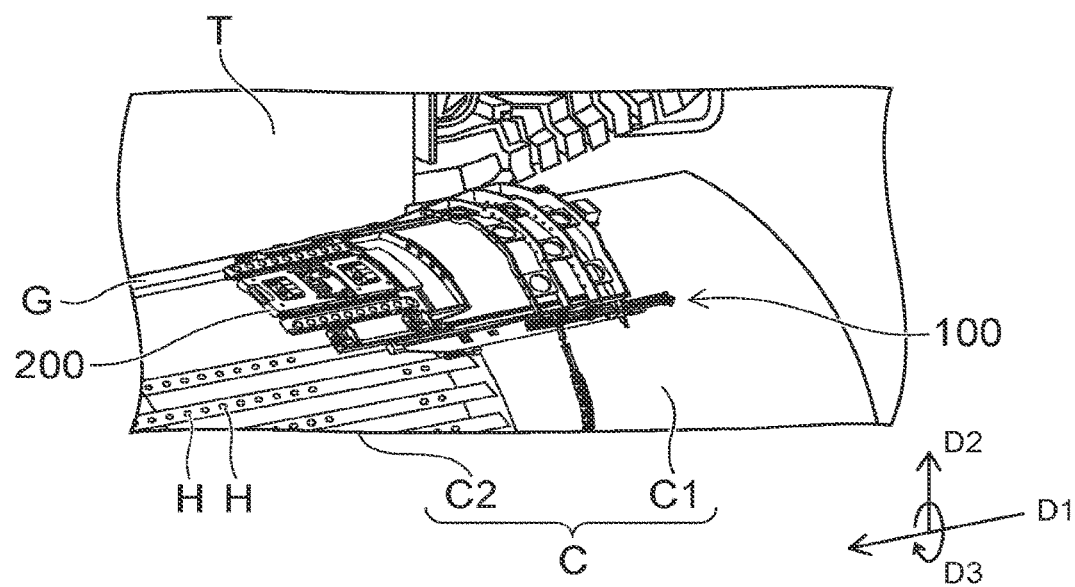

FIG. 7A is a perspective cross-sectional view illustrating an example of equipment to which the holding apparatus according to the embodiment is applied. FIG. 7B is an enlarged view of portion P of FIG. 7A.

Equipment E illustrated in FIG. 7A includes the columnar body C, and a tubular body T provided around the columnar body C, In the equipment E, the columnar body C has a circular columnar configuration. The tubular body T has a circular tubular configuration. The columnar body C rotates inside the tubular body T. A rotation axis Ax of the columnar body C is parallel to the first direction D1. For example, the equipment E is a generator.

As illustrated in FIG. 7B, the holding apparatus 100 is provided in a gap G between the columnar body C and the tubular body T. The moving body 200 moves through the gap G along the first direction D1, Many holes H exist in the surface of the columnar body C. For example, the moving body 200 inspects the interiors of the holes H while moving over the surface of the columnar body C. Or, the moving body 200 inspects the tubular body T while moving over the surface of the columnar body C. For example, a control system that includes the holding apparatus 100 and the moving body 200 is used as an inspection system inspecting the columnar body C or the tubular body T.

For example, the moving body 200 inspects the columnar body C or the tubular body T at some point in the third direction D3 while moving along the first direction D1 on the surface of the columnar body C. When the inspection of the columnar body C or the tubular body T at the point in the third direction D3 is completed, the moving body 200 is moved in the third direction D3 by the holding apparatus 100. Subsequently, the moving body 200 inspects the columnar body C or the tubular body T at another point in the third direction D3 while moving along the first direction D1 on the surface of the columnar body C. A wide area of the columnar body C or the tubular body T is inspected by alternately repeating the movement in the first direction D1 of the moving body 200 and the movement in the third direction D3 of the moving body 200 due to the holding apparatus 100.

If the holding apparatus 100 can hold the moving body 200 more stably, the moving body 200 can be moved more accurately to the prescribed position. For example, the misalignment in the third direction D3 of the moving body 200 can be suppressed. The points of the columnar body C or the points of the tubular body T can be inspected more accurately thereby. The occurrence of misalignment in the third direction D3 of the moving body 200 in which a portion of the columnar body C or the tubular body T is not inspected can be suppressed.

Figure 8:
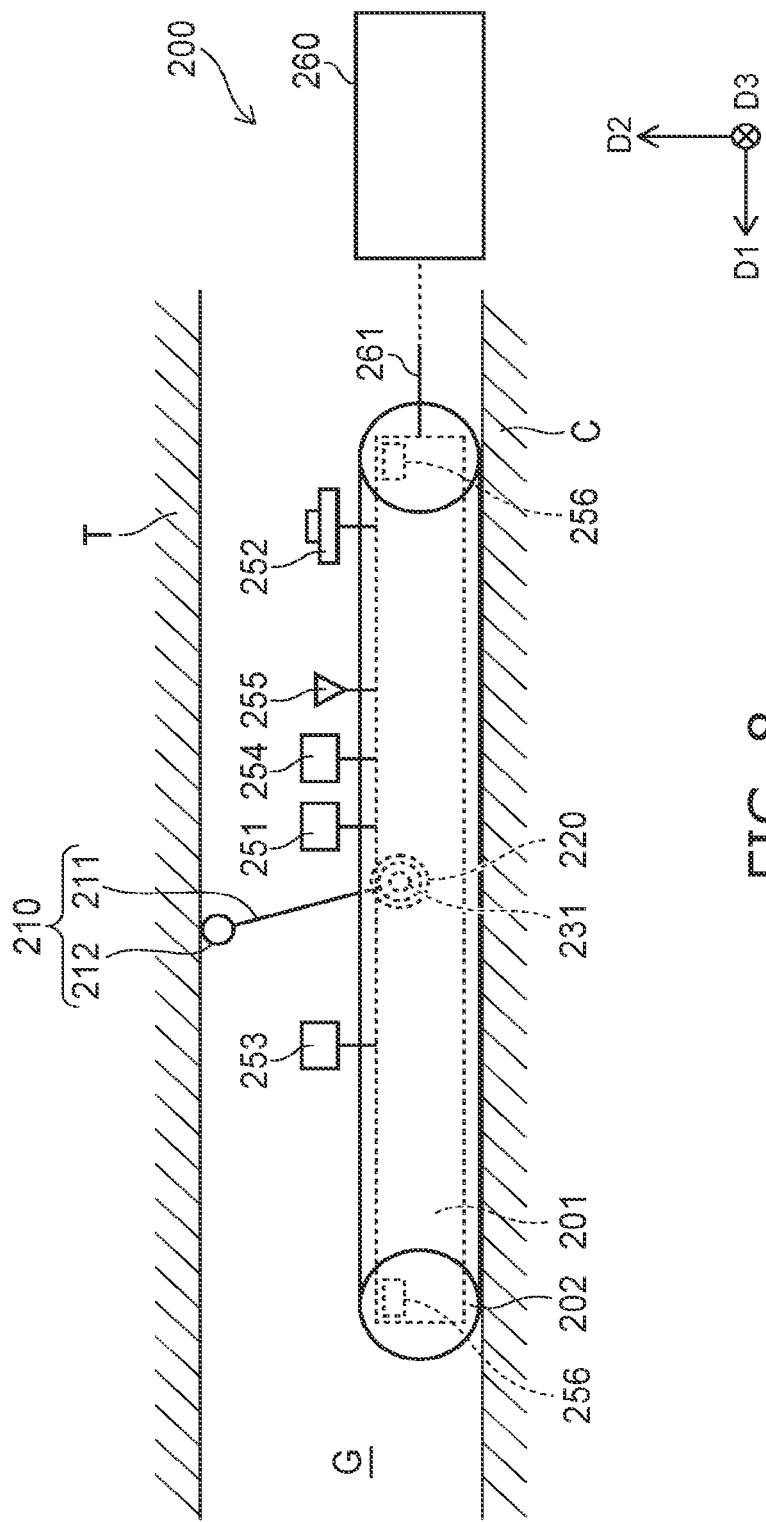
FIG. 8 is a schematic side view illustrating the moving body.

FIG. 8 is a schematic side view illustrating the moving body.

Figure 9:
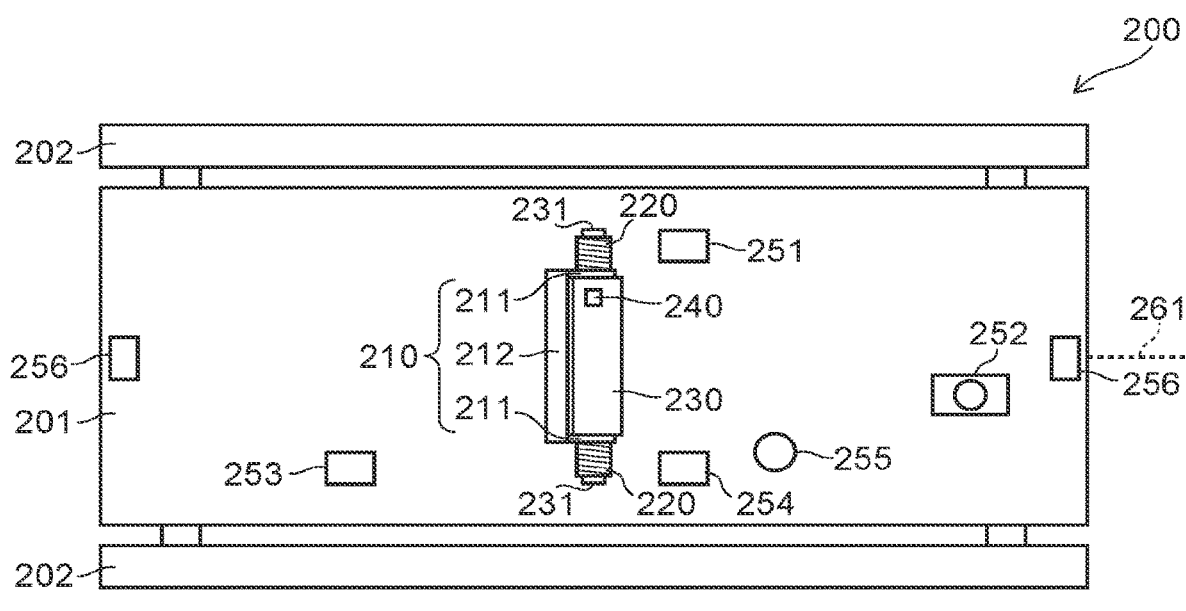
FIG. 9 is a schematic plan view illustrating the moving body.

FIG. 9 is a schematic plan view illustrating the moving body.

For example, as illustrated in FIG. 8 and FIG. 9, the moving body 200 includes a vehicle body 201, a crawler 202, a contact part 210, an elastic member 220, an actuator 230, a detector 240, and a controller 260.

The crawler 202 includes a belt and multiple wheels. The vehicle body 201 advances or retreats due to the multiple wheels rotating in a state in which the belt contacts the surface of the columnar body C. The crawlers 202 are provided respectively at the left and right. Also, the travel direction of the moving body 200 can be oriented toward the left side or the right side by adjusting the rotational speeds of the wheels of the crawlers 202. Instead of the crawler 202 which is a caterpillar track, the moving body 200 may include only a wheel or wheels.

The contact part 210 can contact the tubular body T. The moving body 200 can switch between a contacting state in which the contact part 210 contacts the tubular body T, and a separated state in which the contact part 210 is separated from the tubular body T.

For example, the contact part 210 includes an arm 211 and a roller 212, One end of the arm 211 is pivotally supported by the vehicle body 201. The arm 211 is rotatable with respect to the vehicle body 201. The roller 212 is provided at the other end of the arm 211. The roller 212 contacts the tubular body T. By providing the roller 212, the moving body 200 can move smoothly over the surface of the columnar body C while causing the contact part 210 to contact the surface of the tubular body T.

The elastic member 220 is coupled to the vehicle body 201 and the arm 211. The elastic member 220 generates an elastic force corresponding to the angle between the vehicle body 201 and the arm 211. For example, the elastic member 220 applies the elastic force to the arm 211 along the rotation direction of the arm 211. The direction of the elastic force is arbitrary. The elastic force that is generated by the elastic member 220 at an angle θ may be in a direction to increase the angle θ or may be in a direction to reduce the angle θ.

As illustrated in FIG. 2, the actuator 230 is coupled to the vehicle body 201 and the arm 211. The actuator 230 is a drive mechanism fixed with respect to the vehicle body 201. A force is applied to the arm 211 by driving the actuator 230. For example, the actuator 230 can generate torque on the angle between the vehicle body 201 and the arm 211 in a direction to increase and/or in a direction to decrease.

The actuator 230 is, for example, an electric motor coupled to the one end of the arm 211, The elastic member 220 is a torsion coil spring coupled to the vehicle body 201 and the arm 211. For example, a rotation axis 231 of the actuator 230 coupled to the one end of the arm 211 protrudes to the opposite side of the arm 211. The protruding rotation axis 231 is provided at an inner side of at least a portion of the elastic member 220.

The detector 240 detects the angle of the arm 211 with respect to the vehicle body 201. The detector 240 is, for example, a rotary encoder provided in the actuator 230.

The specific configuration of the contact part 210 is modifiable as appropriate. For example, the arm 211 may include multiple links coupled to each other, and may be extendable/retractable in the second direction D2. The specific configurations of the elastic member 220 and the actuator 230 also are modifiable as appropriate according to the configuration of the contact part 210.

A tester 251 inspects at least one of the columnar body C or the tubular body T. The tester 251 includes, for example, an ultrasonic sensor, a striking device, or a camera that inspects scratches, etc., of these structural components.

Also, the moving body 200 includes, for example, a camera 252, a measuring instrument 253, a detector 254, an illuminator 255, and a camera 256. The camera 252 images the surface of the columnar body C or the tubular body T. The measuring instrument 253 measures the distance between the surfaces of the vehicle body 201 and the tubular body T. The detector 254 detects the unevenness of the surface of the columnar body C. The illuminator 255 illuminates the columnar body C or the tubular body T. The camera 256 images the travel direction of the moving body 200.

Because the arm 211 is pressed onto the surface of the tubular body T, a resisting force on the moving body 200 from the surface of the tubular body T is generated. The moving body 200 is pressed toward the surface of the columnar body C by the resisting force. The controller 260 controls the actuator 230 and adjusts the torque acting on the arm 211 from the actuator 230. Thereby, the force (hereinbelow, called the pressing force) that presses the arm 211 to the surface of the tubular body T can be adjusted; and the resisting force that acts on the moving body 200 can be adjusted, Specifically, the controller 260 controls the actuator 230 so that the pressing force is a preset force.

The controller 260 also may control the operations of the camera 252, the measuring instrument 253, the detector 254, the illuminator 255, the camera 256, etc. For example, the controller 260 is placed outside the gap G and has a wired connection to the vehicle body 201 via a cable 261. Or, the vehicle body 201 may have a wireless connection to the controller 260. Or, the controller 260 may be mounted in the vehicle body 201.

Figure 10A:
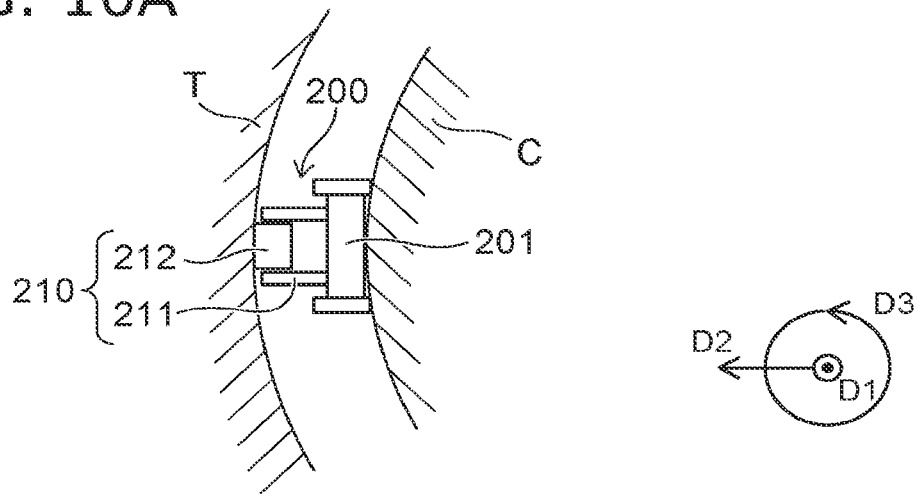
FIGS. 10A to 10C are schematic views illustrating operations of the moving body.
Figure 10B:
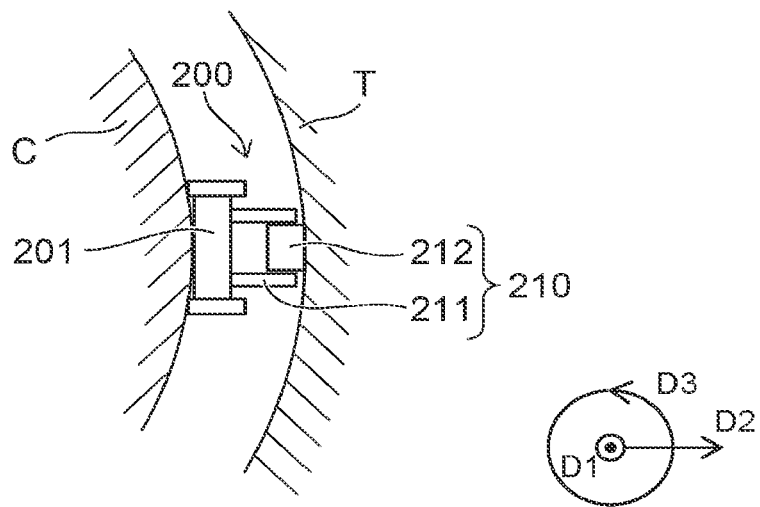
Figure 10C:
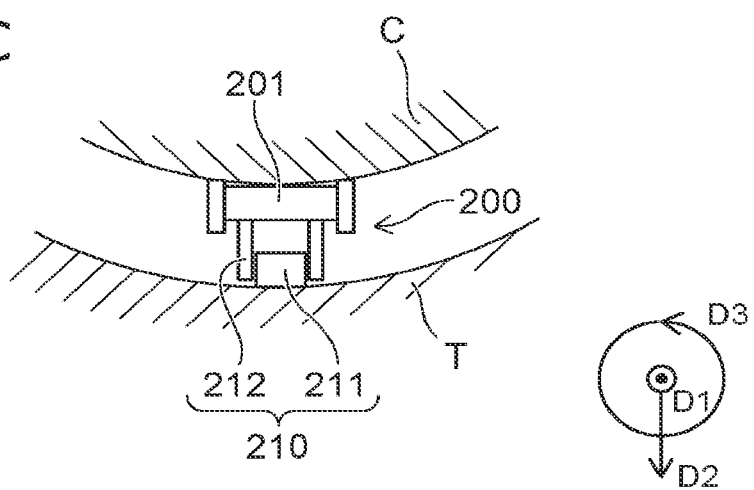

FIGS. 10A to 10C are schematic views illustrating operations of the moving body.

As illustrated in FIG. 10A and FIG. 10B, there are cases where the moving body 200 has a horizontal orientation and moves over a vertical portion of the surface of the columnar body C, In other words, the moving body 200 may move over the surface of the columnar body C in a state in which the direction of a line connecting the contact portion between the moving body 200 and the columnar body C and the contact portion between the moving body 200 and the tubular body T is horizontal.

Or, as illustrated in FIG. 10C, there are cases where the moving body 200 has a downward orientation and moves over a horizontal portion of the surface of the columnar body C. In other words, the moving body 200 may move over the surface of the columnar body C in a state in which the direction from the contact portion between the moving body 200 and the tubular body T toward the contact portion between the moving body 200 and the columnar body C is the reverse of the direction of gravity.

As illustrated in FIG. 10A to FIG. 10C, the angle of the line direction with respect to the direction of gravity changes according to the position in the third direction D3 of the moving body 200, The moving body 200 causes the contact part 210 to contact the tubular body T so that the moving body 200 does not fall at any position.

In the equipment E illustrated in FIG. 7A, the gap G which is between the columnar body C and the tubular body T is micro. It is desirable for the holding apparatus 100 to be small to provide the holding apparatus 100 in such a micro gap G. To downsize the holding apparatus 100, it is particularly effective to downsize the first to fourth drivers 131 to 134, If the first to fourth drivers 131 to 134 are downsized, the outputs of these drivers are reduced; and the holding of the moving body 200 may become unstable. However, in the holding apparatus 100 according to the embodiment, the moving body 200 can be held more stably by the structure of the first holder 111 and the structure of the second holder 112 described above. Accordingly, particularly in the micro gap G, the holding apparatus 100 according to the embodiment is provided favorably.

As illustrated in FIG. 10A to FIG. 10C, the orientation of the moving body 200 when being held changes diversely. In other words, the direction of the line connecting the contact portion between the moving body 200 and the columnar body C and the contact portion between the moving body 200 and the tubular body T changes diversely in a plane perpendicular to the first direction D1. When the orientation of the moving body 200 changes, the force of gravity acting on the moving body 200 in the second direction D2 and the force of gravity acting on the moving body 200 in the third direction D3 change.

According to the holding apparatus 100 according to the embodiment, the movement of the moving body 200 in the directions (the second direction D2 and the third direction D3) perpendicular to the first direction D1 can be suppressed by the first holder 111 and the second holder 112 for any orientation.

FIG. 11A to FIG. 11D are schematic views illustrating operations between the moving body and the holding apparatus according to the embodiment.

Figure 11A:
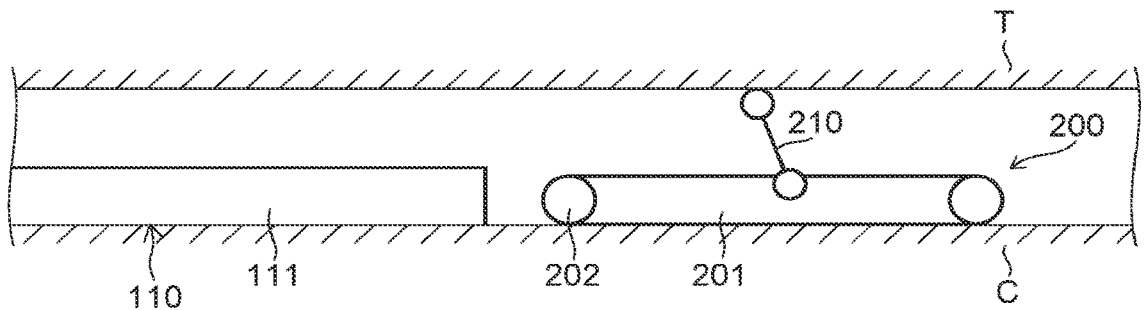
FIGS. 11A to 11D are schematic views illustrating operations between the moving body and the holding apparatus according to the embodiment.
Figure 11B:
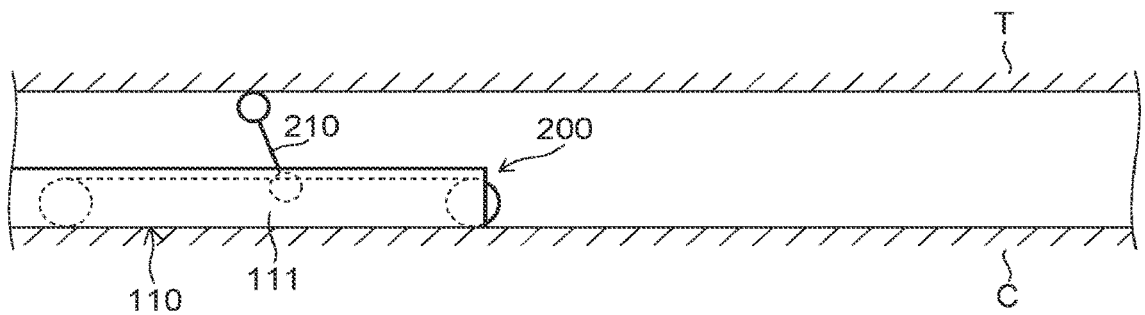

FIG. 11A to FIG. 11D illustrate the state when the moving body 200 is held by the holding mechanism 110. As illustrated in FIG. 11A, the moving body 200 moves over the surface of the columnar body C while causing the contact part 210 to contact the tubular body T. Subsequently, as illustrated in FIG. 11B, the moving body 200 moves to the hold position while causing the contact part 210 to contact the tubular body T.

For example, in the state of FIG. 11B, the detector 180 of the holding apparatus 100 (shown in FIG. 5B) detects the moving body 200 to be at the hold position. The controller 190 receives a detection result output from the detector 180 and transmits a signal to the moving body 200. When the controller 260 of the moving body 200 receives this signal, the contact part 210 is separated from the surface of the tubular body T as illustrated in FIG. 11C.

After the contact part 210 is separated from the surface of the tubular body T, the controller 260 transmits a signal to the holding apparatus 100. When the controller 190 of the holding apparatus 100 receives this signal, the controller 190 changes the position in the second direction D2 of the moving body 200 as illustrated in FIG. 11D.

Figure 11C:
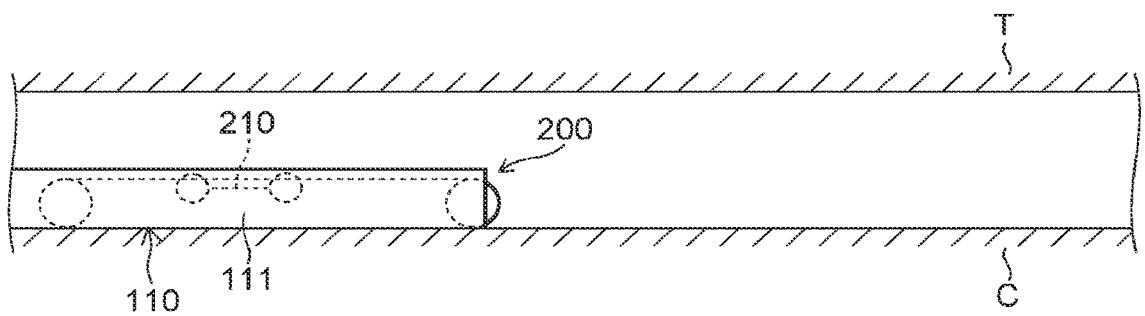
Figure 11D:
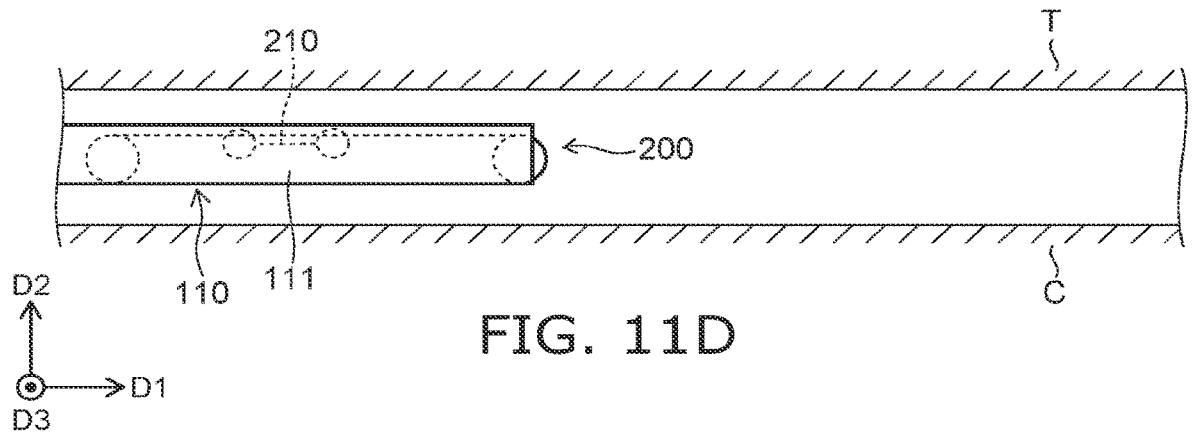

In the method illustrated in FIG. 11B to FIG. 11D, the holding apparatus 100 moves the moving body 200 in a direction away from the surface of the columnar body C after the contact part 210 is separated from the tubular body T. Instead of this method, the holding apparatus 100 may change the position in the second direction D2 of the moving body 200 in a state in which the contact part 210 is caused to contact the tubular body T. For example, the controller 260 weakens the pressing force of the contact part 210 when the holding apparatus 100 moves the moving body 200.

However, if the moving body 200 is moved in the state in which the contact part 210 is caused to contact the tubular body T, it is necessary for the first to fourth drivers 131 to 134 to output larger forces. The first to fourth drivers 131 to 134 must be enlarged to increase the outputs of the first to fourth drivers 131 to 134. As a result, the holding apparatus 100 is enlarged. Accordingly, to downsize the holding apparatus 100, it is desirable to perform the method illustrated in FIG. 11B to FIG. 11D.

A method for controlling the first to fourth drivers 131 to 134 of the holding apparatus 100 according to the embodiment will now be described.

When the moving body 200 is moved by the holding mechanism 110, it is desirable for the shaking or the like of the holding mechanism 110 and the moving body 200 to be small and more stable. If the holding mechanism 110 or the moving body 200 shakes when moving the moving body 200, there is a possibility that the moving body 200 may fall from the holding mechanism 110. Or, there is a possibility that the holding mechanism 110 and the moving body 200 may contact and damage the columnar body C or the tubular body T.

To suppress the shaking of the holding mechanism 110 and the moving body 200, it is desirable to maintain, while moving the moving body 200, the orientation that the moving body 200 has when the holding by the holding mechanism 110 is started. In other words, it is desirable for the difference to be small between the orientation while moving the moving body 200 and the orientation when the holding of the moving body 200 is started.

The orientation of the holding mechanism 110 corresponds to the relationship between the direction of gravity and an imaginary plane generated by connecting multiple designated components included in the holding mechanism 110. For example, the imaginary plane of the holding mechanism 110 passes through the first holder 111 and the second holder 112. A change of the orientation of the holding mechanism 110 means that the angle between the imaginary plane and the direction of gravity has changed.

Similarly, the orientation of the moving body 200 corresponds to the relationship between the direction of gravity and an imaginary plane generated by connecting multiple designated components included in the moving body 200. For example, the imaginary plane of the moving body 200 passes through the wheels of the crawlers 202. A change of the orientation of the moving body 200 means that the angle between the imaginary plane and the direction of gravity has changed.

FIG. 12A to FIG. 12D are schematic views illustrating operations of the first to fourth drivers of the holding apparatus according to the embodiment.

The first to fourth drivers 131 to 134 are connected respectively to the first to fourth links 141 to 144. One end is connected to the holding mechanism 110 for each of the first to fourth links 141 to 144. Here, as illustrated in FIG. 12A to FIG. 12D, an imaginary plane that connects the one ends of the first to fourth links 141 to 144 is considered. The orientation of the holding mechanism 110 and the moving body 200 corresponds to the tilt of the imaginary plane (the angle between the imaginary plane and the direction of gravity). The orientation of the holding mechanism 110 and the moving body 200 changes when the tilt of the imaginary plane changes. Accordingly, the change of the orientation of the holding mechanism 110 and the moving body 200 can be suppressed by reducing the change of the tilt of the imaginary plane while moving the moving body 200.

Figure 12A:
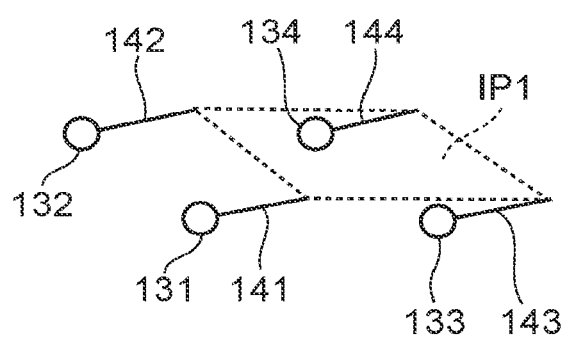
FIGS. 12A to 12D are schematic views illustrating operations of the first to fourth drivers of the holding apparatus according to the embodiment.

Here, an example will be described in which the first to fourth drivers 131 to 134 are motors. FIG. 12A illustrates the case where the states of the motors of the first to fourth drivers 131 to 134 are substantially the same. The tilt of an imaginary plane IP1 of FIG. 12A is substantially the same as the tilt when the holding of the moving body 200 is started.

FIG. 123 illustrates the case where the state of the first driver 131 and the state of the third driver 133 are different from the state of the second driver 132 and the state of the fourth driver 134. An imaginary plane IP2 illustrated in FIG. 123 is tilted downward from the second link 142 and the fourth link 144 toward the first link 141 and the third link 143.

Figure 12C:
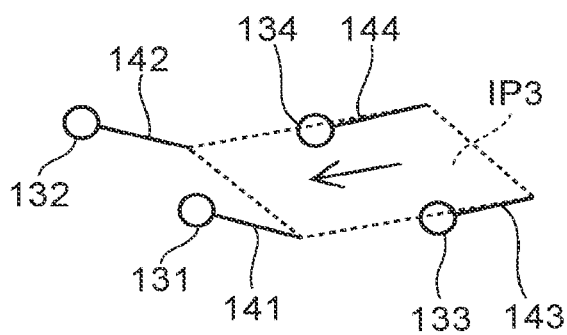

FIG. 12C illustrates the case where the state of the first driver 131 and the state of the second driver 132 are different from the state of the third driver 133 and the state of the fourth driver 134. An imaginary plane IP3 illustrated in FIG. 12C is tilted downward from the third link 143 and the fourth link 144 toward the first link 141 and the second link 142.

Figure 12B:
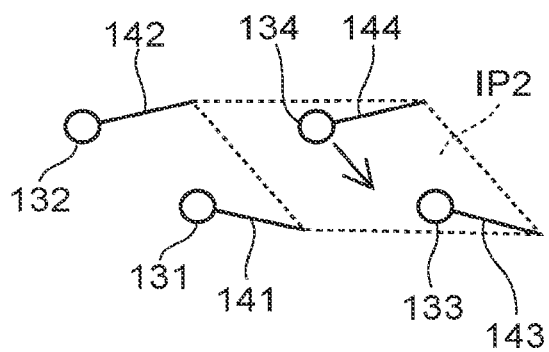
Figure 12D:
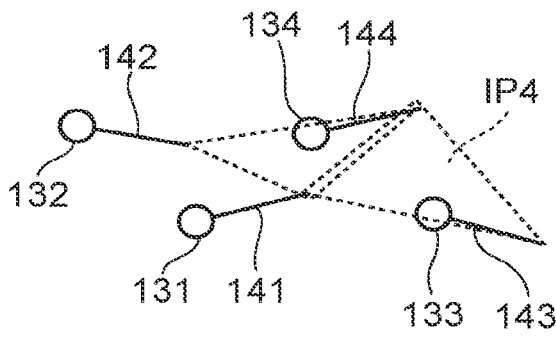
Figure 12D:
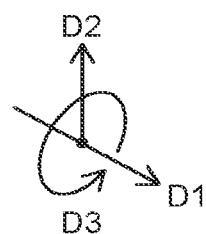

FIG. 12D illustrates the case where the state of the second driver 132 and the state of the third driver 133 are different from the state of the first driver 131 and the state of the fourth driver 134. Twisting has occurred in an imaginary plane IP4 of FIG. 12D. In other words, an imaginary plane that is generated by the first driver 131, the second driver 132, and the fourth driver 134 and an imaginary plane that is generated by the first driver 131, the third driver 133, and the fourth driver 134 exist.

For example, the rotation amounts of the drivers from the holding start time of the moving body 200 are used as the states of the drivers. If the rotation amounts of the drivers are the same, the orientation of the holding mechanism 110 and the moving body 200 substantially has not changed from the holding start time as illustrated in FIG. 12A. Or, the loads on the drivers are used as the states of the drivers. If the same force is output to the holding mechanism 110 from each of the drivers, the orientation of the holding mechanism 110 and the moving body 200 substantially does not change from the holding start time; and the loads on the drivers are substantially the same. For example, the controller 190 detects the rotation amounts or the loads of the drivers.

In the holding apparatus 100 according to the embodiment, the first driver 131 and the second driver 132 are connected to the third driver 133 and the fourth driver 134 via the slider 154, the slider 155, and the connector 156. Accordingly, the orientations of the holding mechanism 110 and the moving body 200 corresponding to the imaginary planes IP3 and IP4 illustrated in FIG. 12C and FIG. 12D actually do not occur. This is because when operating the first to fourth drivers 131 to 134, the state of the first driver 131 is the same as the states of the third drivers; and the state of the second driver 132 is the same as the state of the fourth driver 134. However, the imaginary planes IP3 and IP4 illustrated in FIG. 12C and FIG. 12D are considered in the calculations based on the states of the first to fourth drivers 131 to 134.

The controller 190 generates the imaginary planes illustrated in FIG. 12A to FIG. 12D based on the states of the first to fourth drivers 131 to 134. For example, the position in the second direction D2 of the one end of the first link 141 is taken as z1, The position in the second direction D2 of the one end of the second link 142 is taken as z2. The position in the second direction D2 of the one end of the third link 143 is taken as z3. The position in the second direction D2 of the one end of the fourth link 144 is taken as z4.

For example, the lengths of the links (the distances between the portions connected to the drivers and the portions connected to the holding mechanism 110) are preset. In such a case, by knowing the rotation amounts of the first to fourth drivers 131 to 134, the positions z1 to z4 of the one ends of the first to fourth links 141 to 144 can be calculated. By using an orthogonal matrix and z1 to z4, the positions of the imaginary planes illustrated in FIG. 12A to FIG. 12D are calculated by the formula illustrated in FIG. 13.

FIG. 13 is a formula to which the holding apparatus according to the embodiment refers.

In the formula of FIG. 13, p1 is the position in the second direction D2 of the imaginary plane IP1 shown in FIG. 12A. p2 is the position in the second direction D2 of the imaginary plane IP2 shown in FIG. 12B. p3 is the position in the second direction D2 of the imaginary plane IP3 shown in FIG. 12C. p4 is the position in the second direction D2 of the imaginary plane IP4 shown in FIG. 12D. The calculation of the positions p1 to p4 corresponds to the generation of the imaginary planes IP1 to IP4 illustrated in FIG. 12A to FIG. 12D.

FIG. 14A and FIG. 14B are graphs illustrating changes of the positions in the second direction of the imaginary planes when the moving body is moved.

In FIG. 14A and FIG. 14B, the horizontal axis is time t. The vertical axis is the position p in the second direction D2 of each of the imaginary planes. The solid line illustrates the change of the position p of the imaginary plane IP1. The broken line illustrates the change of the position p of the imaginary plane IP2. The dotted line illustrates the change of the position p of the imaginary plane IP3. The broken chain line illustrates the change of the position p of the imaginary plane IP4. In the graphs of FIG. 14A and FIG. 14B, the calculated positions p of the imaginary planes are set to 0 when the holding mechanism 110 holds the moving body 200.

FIG. 14A illustrates the result when the moving body 200 is moved while maintaining the orientation at the holding start time of the moving body 200. In such a case, it can be seen from FIG. 14A that only the position of the imaginary plane IP1 changes. The positions of the imaginary planes IP2 to IP4 substantially do not change. This shows that the shaking or the like of the holding mechanism 110 and the moving body 200 is small and stable when the moving body 200 is moved.

FIG. 14B illustrates a result when shaking of the holding mechanism 110 and the moving body 200 occurs when moving the moving body 200. In the example of FIG. 14B, the position of the imaginary plane IP1 and the position of the imaginary plane IP2 change. This shows that the state of the first driver 131 and the state of the third driver 133 are different from the second driver 132 and the state of the fourth driver 134 as in the imaginary plane IP2 illustrated in FIG. 12B.

Figure 15:
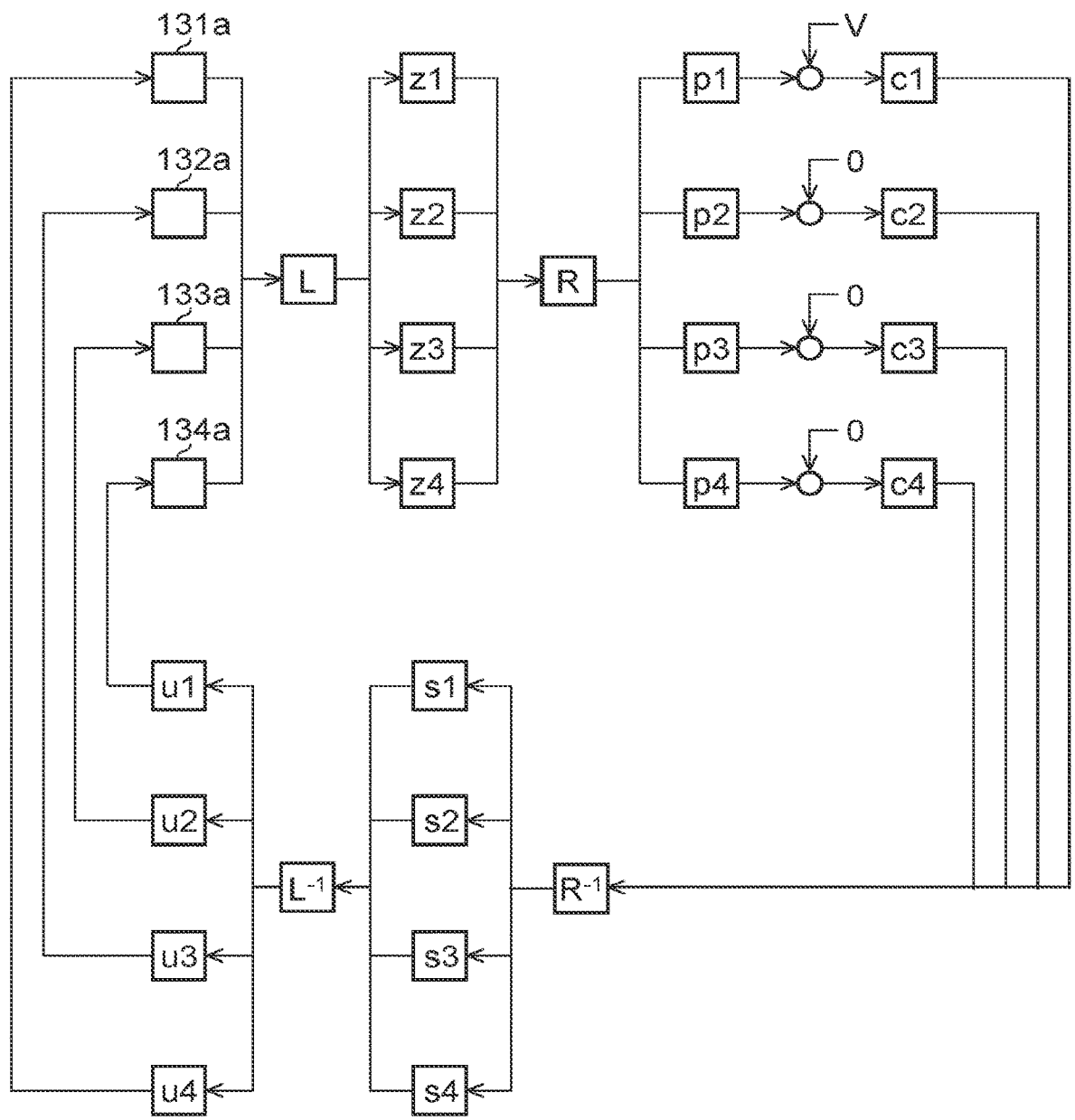
FIG. 15 is a block diagram schematically illustrating the control of the holding apparatus according to the embodiment.

FIG. 15 is a block diagram schematically illustrating the control of the holding apparatus according to the embodiment.

To move the moving body 200 more stably, it is desirable for the changes of the positions of the imaginary planes IP2 to IP4 to be small. The controller 190 controls the first to fourth drivers 131 to 134 to suppress the changes of the positions of the imaginary planes IP2 to IP4.

FIG. 15 illustrates the state in which the positions z1 to z4 of the one ends of the first to fourth links 141 to 144 are determined using a state 131a of the first driver 131, a state 132a of the second driver 132, a state 133a of the third driver 133, a state 134a of the fourth driver 134, and a transformation matrix L. The transformation matrix L represents the parameters of the first to fourth links 141 to 144 for calculating the positions z1 to z4 from the states 131a to 134a.

For example, the controller 190 calculates the positions z1 to z4 by using the product of the transformation matrix L and the states 131a to 134a. The controller 190 calculates the positions p1 to p4 of the imaginary planes by using the product of the orthogonal matrix R illustrated in FIG. 13 and the positions z1 to z4, Target values are input respectively for the positions p1 to p4. As illustrated in FIG. 15, a target value V is input for the position p1. The target value V represents the desirable position in the second direction D2 of the imaginary plane IP1 at each time t. For example, the target value V is set so that the position in the second direction of the imaginary plane IP1 changes along the path illustrated in FIG. 14A. 0 is input as the target values of the positions p2 to p4.

The controller 190 calculates deviations c1 to c4 respectively between the positions p1 to p4 and the target values. The deviations c1 to c4 respectively represent the differences between the target values and the positions of the imaginary planes IP1 to IP4, The controller 190 calculates the product of a transposed matrix $R^{-1}$ and the deviations c1 to c4. Thereby, the deviations c1 to c4 are converted into deviations s1 to s4 respectively representing the differences between the positions of the one ends of the first to fourth links 141 to 144 and the target positions of the one ends of the links.

The controller 190 further calculates operation amounts u1 to u4 by using the deviations s1 to s4 and an inverse matrix $L^{-1}$ of the transformation matrix L. The controller 190 inputs the operation amounts u1 to u4 respectively to the first to fourth drivers 131 to 134 so that the positions of the one ends of the first to fourth links 141 to 144 approach the target positions.

By the control described above, the first to fourth drivers 131 to 134 are operated so that the positions of the imaginary planes IP2 to IP4 do not change and so that the position of the imaginary plane IP1 is along the desired path. In other words, when the moving body 200 is moved by the holding apparatus 100, the shaking of the holding mechanism 110 and the moving body 200 can be suppressed; and the moving body 200 can be held more stably.

As described above, to downsize the holding apparatus 100, it is desirable to downsize the first to fourth drivers 131 to 134. If the first to fourth drivers 131 to 134 are downsized, the outputs of these drivers become small; and the holding of the moving body 200 may become unstable. To hold the moving body 200 more stably, it may be considered to provide, in the holding apparatus 100 or the moving body 200, a detector that detects the orientation of the holding mechanism 110 or the moving body 200. However, in such a case, the holding apparatus 100 or the moving body 200 is enlarged by providing the detector. It is desirable for both the holding apparatus 100 and the moving body 200 to be compact when the holding apparatus 100 and the moving body 200 are provided in the gap G.

Therefore, in the holding apparatus 100 according to the embodiment, the controller 190 generates the imaginary planes representing the orientation of the holding mechanism 110 by using the state of the first driver 131, the state of the second driver 132, the state of the third driver 133, and the state of the fourth driver 134. By generating the imaginary planes, the orientation of the moving body 200 can be estimated without using a detector detecting the orientation of the moving body 200, etc. The controller 190 controls the first to fourth drivers 131 to 134 based on the positions in the second direction D2 of the imaginary planes. Thereby, the change of the orientation when moving the moving body 200 can be suppressed; and the moving body 200 can be held more stably.

As illustrated in FIG. 10A to FIG. 10C, the orientation of the moving body 200 changes diversely particularly when moving over the surface of the columnar body C, When the orientation of the moving body 200 changes, the loads that are applied to the first to fourth drivers 131 to 134 when holding the moving body 200 also change. According to the control method described above, the change of the orientation when moving the moving body 200 can be suppressed even when the loads on the drivers change.

Specifically, the controller 190 generates at least a first imaginary plane and a second imaginary plane. As in the imaginary plane IP1 illustrated in FIG. 12A, the first imaginary plane represents the states of the first to fourth drivers 131 to 134 being substantially the same. The second imaginary plane represents the state of at least one of the first to fourth drivers 131 to 134 being different from the state of another one of the first to fourth drivers 131 to 134. The second imaginary plane is, for example, one of the imaginary planes IP2 to IP4 illustrated in FIG. 12B to FIG. 12D. The controller 190 controls the first driver 131, the second driver 132, the third driver 133, and the fourth driver 134 so that the change of the position in the second direction of the second imaginary plane is suppressed and so that the position in the second direction D2 of the first imaginary plane is along the prescribed path.

By suppressing the change of the position in the second direction D2 of the second imaginary plane and moving the position in the second direction D2 of the first imaginary plane along the prescribed path, the change of the orientation of the holding mechanism 110 and the moving body 200 while moving the moving body 200 can be suppressed.

Or, instead of suppressing the change of the position in the second direction D2 of the second imaginary plane, the controller 190 may compare the change of the position in the second direction D2 of the second imaginary plane to a prescribed condition. For example, a threshold of the position in the second direction D2 is preset. The controller 190 compares, to the threshold, the change of the position in the second direction D2 of the second imaginary plane compared to the holding start time of the moving body 200, When the change of the position exceeds the threshold, the controller 190 controls the first to fourth drivers 131 to 134 to reduce the speed of the holding mechanism 110. The holding mechanism 110 may be stopped by the reduction of the speed. For example, the controller 190 may stop the holding mechanism 110 by stopping the operations of the first to fourth drivers 131 to 134, The threshold is set in a range such that the moving body 200 does not fall from the holding mechanism 110. The change of the position exceeding the threshold shows that the orientation of the holding mechanism 110 and the moving body 200 is changing greatly compared to the holding start time. When the change of the position exceeds the threshold, the likelihood of the moving body 200 falling from the holding mechanism 110 can be reduced by reducing the speed of the holding mechanism 110.

A threshold of the speed in the second direction D2 of the second imaginary plane may be preset. The controller 190 compares the change of the position in the second direction D2 of the second imaginary plane per unit time to the threshold. In other words, the change of the position in the second direction D2 of the second imaginary plane per unit time is the speed in the second direction D2 of the second imaginary plane. When the speed of the second imaginary plane exceeds the threshold, the controller 190 controls the first to fourth drivers 131 to 134 to reduce the speed of the holding mechanism 110. The speed exceeding the threshold shows that the orientation of the holding mechanism 110 and the moving body 200 is changing abruptly. When the speed exceeds the threshold, the likelihood of the moving body 200 falling from the holding mechanism 110 can be reduced by reducing the speed of the holding mechanism 110.

The controller 190 may store a grounding point where the holding mechanism 110 contacts the surface of the columnar body C based on the change of the position in the second direction D2 of the first imaginary plane. For example, the controller 190 determines the grounding point where the holding mechanism 110 contacts the surface of the columnar body C to be the point of the holding mechanism 110 when the position in the second direction D2 of the first imaginary plane no longer changes even when operating the first to fourth drivers 131 to 134. The controller 190 stores the position in the second direction D2 of the grounding point.

For example, the controller 190 controls the first to fourth drivers 131 to 134 to reduce the speed of the holding mechanism 110 after operating the first to fourth drivers 131 to 134 and before the position in the second direction D2 of the first imaginary plane reaches the stored grounding point. Thereby, the impact can be reduced when the holding mechanism 110 contacts the surface of the columnar body C. Thereby, damage of the drivers, the holding mechanism 110, the moving body 200, etc., can be suppressed.

The method for controlling the first to fourth drivers 131 to 134 described above is applicable also in the case where the holding apparatus 100 is provided somewhere other than between the columnar body C and the tubular body T. The holding apparatus 100 holds an object provided on any surface (a first surface) by using the holding mechanism 110. The holding apparatus 100 changes the position of the object in a direction perpendicular to the first surface by operating the first to fourth drivers 131 to 134 in a state in which the object is held by the holding mechanism 110. At this time, the controller 190 controls the first to fourth drivers 131 to 134 based on the position of an imaginary plane in the perpendicular direction. By performing the control method, a detector that detects the orientation of the holding mechanism 110 or the object is unnecessary; and the holding apparatus 100 can be downsized. Also, even without the detector, the change of the orientation when moving the object can be suppressed; and the object can be held more stably.

A case is described in the example described above where the imaginary plane is generated using four links connected respectively to four drivers. The control method described above is applicable also to holding apparatuses of other configurations including at least three drivers. If the holding apparatus includes three drivers and three links, an imaginary plane that passes through one end for each of the three links is generated. Accordingly, a control method similar to that recited above can be performed, FIG. 16A to FIG. 16C are schematic views illustrating operations of the first to third drivers of the holding apparatus according to the modification.

Figure 16A:
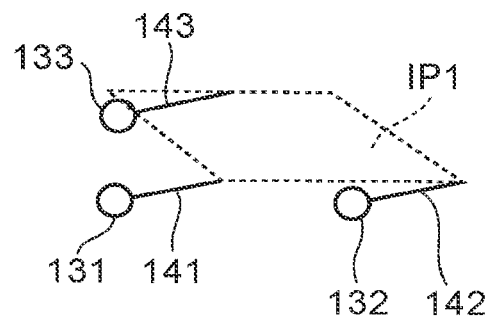
FIGS. 16A to 16C are schematic views illustrating operations of the first to third drivers of the holding apparatus according to the modification.
Figure 16C:
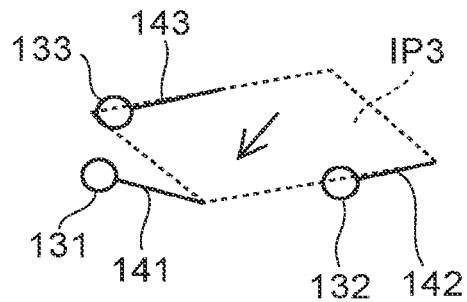
Figure 16B:
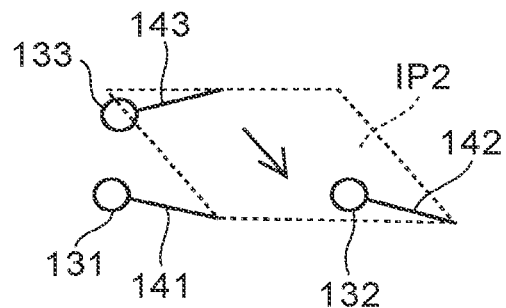
Figure 16B:
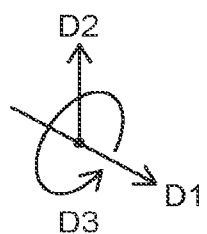

For example, as illustrated in FIG. 16A to FIG. 16C, the holding apparatus according to the modification includes the first to third drivers 131 to 133 and the first to third links 141 to 143. In the holding apparatus, the three imaginary planes IP1 to IP3 are generated using the states of the first to third drivers 131 to 133. Similarly to FIG. 12A, the tilt of the imaginary plane IP1 illustrated in FIG. 16A is substantially the same as the tilt when the holding of the moving body 200 is started. FIG. 16B and FIG. 16C illustrate the imaginary planes IP2 and IP3 which are tilted compared to when the holding of the moving body 200 is started. The imaginary plane IP1 is an example of the first imaginary plane. The imaginary plane IP2 or IP3 is an example of the second imaginary plane.

Even in the case illustrated in FIG. 16A to FIG. 16C, similarly to the control method described above, the controller 190 controls the first to third drivers 131 to 133 so that the changes of the positions of the imaginary planes IP2 and IP3 are suppressed and so that the position of the imaginary plane IP1 is along a prescribed path. Thereby, the shaking of the holding mechanism 110 and the moving body 200 when moving the moving body 200 can be suppressed; and the moving body 200 can be held more stably. This is similar also for cases where the holding apparatus includes five or more drivers.

The control method described above is applicable also to holding mechanisms 110 other than those illustrated in FIG.

1 to FIG. 6. For example, the holding mechanism 110 may include a plate-like stage. The holding mechanism 110 holds the moving body 200 by attracting and holding the moving body 200 to the stage. The holding apparatus 100 moves the moving body 200 on the stage along the second direction D2 by operating drivers connected to the stage. The control method described above may be performed to maintain the orientation that the stage and the moving body 200 have at the holding start time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A holding apparatus holding a moving body and changing a position of the moving body in a second direction perpendicular to a surface of a columnar body, the surface of the columnar body extending in a first direction, the moving body being movable along the first direction,
the apparatus comprising:
a first holder and a second holder separated from each other in a third direction perpendicular to the first direction and the second direction, the third direction being along a circumferential direction of the columnar body; and
a movement mechanism movable over the surface of the columnar body, the movement mechanism being configured to move the first holder and the second holder in the third direction,
the first holder including a first portion and a second portion separated from each other in the second direction, and a third portion,
the second holder including a fourth portion and a fifth portion separated from each other in the second direction, and a sixth portion, and
the moving body being held by the first holder and the second holder in a state in which the moving body is at a hold position, the hold position being where the moving body opposes the third portion and the sixth portion in the third direction and is between the first portion and the second portion and between the fourth portion and the fifth portion in the second direction.

2. The apparatus according to claim 1, wherein the first holder and the second holder are movable in the third direction in a state in which the moving body is separated from the surface of the columnar body by the first holder and the second holder.

3. The apparatus according to claim 1, further comprising:
a first coupler coupling the first holder and the movement mechanism; and
a second coupler coupling the second holder and the movement mechanism,
the columnar body being positioned between the first holder and the movement mechanism and between the second holder and the movement mechanism, and
the first holder and the second holder being moved in the third direction by the movement mechanism moving in the third direction in a state in which the moving body is separated from the surface of the columnar body by the first holder and the second holder.

4. The apparatus according to claim 3, wherein the first holder, the second holder, the movement mechanism, the first coupler, and the second coupler are positioned around the columnar body along a plane parallel to the circumferential direction.

5. The apparatus according to claim 3, wherein the columnar body is positioned between the first holder and the movement mechanism, between the second holder and the movement mechanism, and between the first coupler and the second coupler.

6. The apparatus according to claim 3, wherein in a state where the moving body is separated from the surface of the columnar body by the first holder and the second holder, the movement mechanism moves in the third direction to move the moving body in the third direction.

7. The apparatus according to claim 6, wherein
the first coupler and the second coupler are positioned opposite to each other across the columnar body,
the first coupler is next to the first holder and the movement mechanism, and
the second coupler is next to the second holder and the movement mechanism.

8. The apparatus according to claim 1, further comprising a detector detecting the moving body to be at the hold position,
the moving body being moved by the first holder and the second holder in a direction away from the surface of the columnar body when the detector detects the moving body to have moved to the hold position.

9. The apparatus according to claim 8, wherein
the first holder is configured to modify a first distance in the third direction between the first portion and the second portion,
the second holder is configured to modify a second distance in the third direction between the fourth portion and the fifth portion, and
when the detector detects that the moving body is at the hold position, the first holder shortens the first distance, and the second holder shortens the second distance.

10. The apparatus according to claim 1, further comprising a slider moving the first holder and the second holder along the first direction,
the moving body being moved along the first direction by the slider being operated in a state in which the moving body is separated from the surface of the columnar body by the first holder and the second holder.

11. The apparatus according to claim 1, wherein
the columnar body includes a first columnar part and a second columnar part arranged in the first direction,
a dimension in the second direction of the first columnar part is longer than a dimension in the second direction of the second columnar part,
the moving body moves over a surface of the second columnar part along the first direction, and
the holding apparatus is mounted to the first columnar part.

12. A control system, comprising:
the holding apparatus according to claim 1; and
the moving body moving between the columnar body and a tubular body, the tubular body being provided around the columnar body,
the moving body including a contact part capable of contacting the tubular body, the moving body moving over the surface of the columnar body while causing the contact part to contact the tubular body.

13. The system according to claim 12, wherein
the moving body is configured to switch between a contacting state and a separated state, the contact part being caused to contact the tubular body in the contacting state, the contact part being separated from the tubular body in the separated state, and
the moving body switches the contact part from the contacting state to the separated state when the moving body moves to the hold position.

14. An inspection system, comprising:
the holding apparatus according to claim 1;
the moving body moving between the columnar body and a tubular body, the tubular body being provided around the columnar body,
the moving body including a tester for inspecting the columnar body or the tubular body, and
the moving body inspecting the columnar body or the tubular body while moving over the surface of the columnar body along the first direction.

* * * * *